United States Patent
Zhou et al.

(10) Patent No.: US 12,009,321 B2
(45) Date of Patent: Jun. 11, 2024

(54) PACKAGE SYSTEM AND PACKAGE

(71) Applicant: Intel Corporation, Santa Clara, CA (US)

(72) Inventors: Zhen Zhou, Chandler, AZ (US); Tae Young Yang, Portland, OR (US); Tolga Acikalin, San Jose, CA (US); Johanny Escobar Pelaez, Zapopan (MX); Kenneth P. Foust, Beaverton, OR (US); Chia-Pin Chiu, Tempe, OR (US); Renzhi Liu, Portland, OR (US); Cheng-Yuan Chin, Las Vegas, NV (US)

(73) Assignee: Intel Corporation, Santa Clara, CA (US)

( * ) Notice: Subject to any disclaimer, the term of this patent is extended or adjusted under 35 U.S.C. 154(b) by 657 days.

(21) Appl. No.: 17/131,863

(22) Filed: Dec. 23, 2020

(65) Prior Publication Data

US 2022/0199556 A1    Jun. 23, 2022

(51) Int. Cl.
*H01L 23/66* (2006.01)
*H01L 23/14* (2006.01)
(Continued)

(52) U.S. Cl.
CPC .............. *H01L 23/66* (2013.01); *H01L 23/14* (2013.01); *H01L 29/93* (2013.01); *H01Q 1/2283* (2013.01);
(Continued)

(58) Field of Classification Search
CPC ......... H01L 23/66; H01L 23/14; H01L 29/93; H01L 2223/664; H01L 2223/6677;
(Continued)

(56) References Cited

U.S. PATENT DOCUMENTS

2020/0035625 A1 *   1/2020   Wang .................... H01L 23/552

FOREIGN PATENT DOCUMENTS

| CN | 202443968 U | * | 9/2012 | ........... H01L 23/552 |
| CN | 108109991 A | * | 6/2018 | ............. H01L 21/56 |

OTHER PUBLICATIONS

Timoneda, Xavier et al., "Engineer the Channel and Adapt to It: Enabling Wireless Intra-Chip Communication", IEEE, IEEE Transactions on Communications, May 2020, pp. 3247-3258, vol. 68, Issue 5.

(Continued)

*Primary Examiner* — Phuc T Dang
(74) *Attorney, Agent, or Firm* — Viering, Jentschura & Partner mbB

(57) ABSTRACT

In various aspects, a package system includes at least a first package and a second package arranged on a same side of the package carrier. Each of the first package and the second package comprises an antenna to transmit and/or receive radio frequency signals. A cover may be arranged at a distance over the first package and the second package at the same side of the package carrier as the first package and the second package. The cover comprises at least one conductive element forming a predefined pattern on a side of the cover facing the first package and the second package. The predefined pattern is configured as a frequency selective surface. The package system further includes a radio frequency signal interface wirelessly connecting the antennas of the first package and the second package. The radio frequency signal interface comprises the at least one conductive element.

24 Claims, 23 Drawing Sheets

(51) Int. Cl.
H01L 29/93 (2006.01)
H01Q 1/22 (2006.01)
H01Q 1/42 (2006.01)
H01Q 15/00 (2006.01)
H01Q 15/14 (2006.01)

(52) U.S. Cl.
CPC ........... H01Q 1/422 (2013.01); H01Q 15/002 (2013.01); H01Q 15/0026 (2013.01); H01Q 15/147 (2013.01); H01L 2223/6627 (2013.01); H01L 2223/6677 (2013.01)

(58) Field of Classification Search
CPC .. H01Q 1/422; H01Q 15/002; H01Q 15/0026; H01Q 15/147
USPC ......................................................... 257/728
See application file for complete search history.

(56) References Cited

OTHER PUBLICATIONS

Abadal, Sergi et al., "Wave Propagation and Channel Modeling in Chip-Scale Wireless Communications: A Survey From Millimeter-Wave to Terahertz and Optics", IEEE, IEEE Access, published on Dec. 23, 2019, pp. 278-293, vol. 8.

Tasolamprou, Anna C. et al., "Exploration of Intercell Wireless Millimeter-Wave Communication in the Landscape of Intelligent Metasurfaces", IEEE, IEEE Access, published on Aug. 5, 2019, pp. 122931-122948, vol. 7.

Gong, Shimin et al., "Towards Smart Radio Environment for Wireless Communications via Intelligent Reflecting Surfaces: A Comprehensive Survey", arXiv, Dec. 17, 2019, 31 pages.

Sipal, Vit et al., "Impact of Confined Environments on WiMedia UWB Systems", IEEE, 2011 Antennas and Propagation Conference (LAPC), Nov. 14-15, 2011, 4 pages, Loughborough, UK.

European Search Report issued for the corresponding European Patent application No. 21 19 5238, dated Mar. 2, 2022, 7 pages (for informational purposes only).

Montori, Simone et al., "Reconfigurable and dual-polarization folded reflectarray antenna", IEEE, Oct. 29-Nov. 1, 2012, pp. 735-738, 2012 9th European Radar Conference, Amsterdam, Netherlands.

Rusch, Christian et al., "Holographic mmW-Antennas With TE0 and TM0 Surface Wave Launchers for Frequency-Scanning FMCW-Radars", IEEE, Apr. 2015, pp. 1603-1613, IEEE Transactions on Antennas and Propagation, vol. 63, Issue 4.

* cited by examiner

810

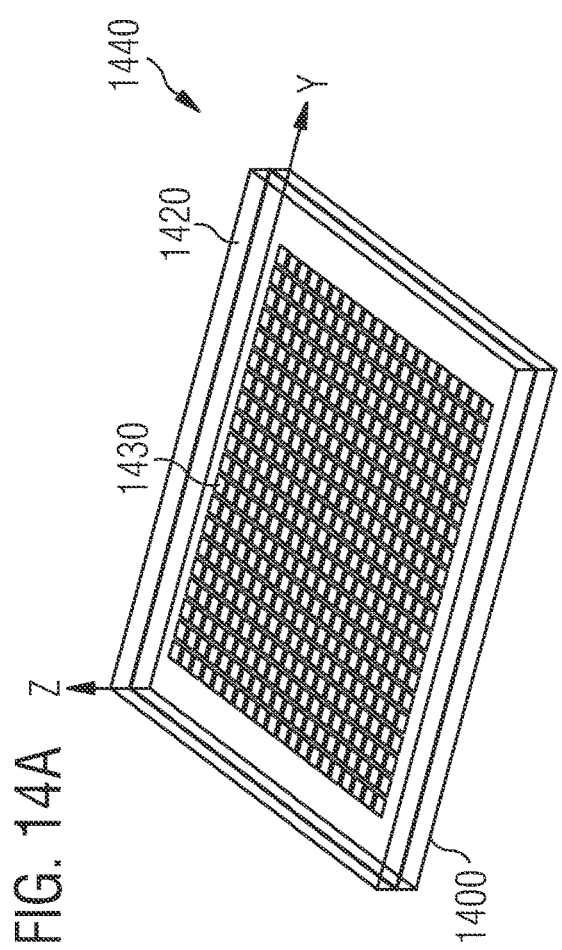
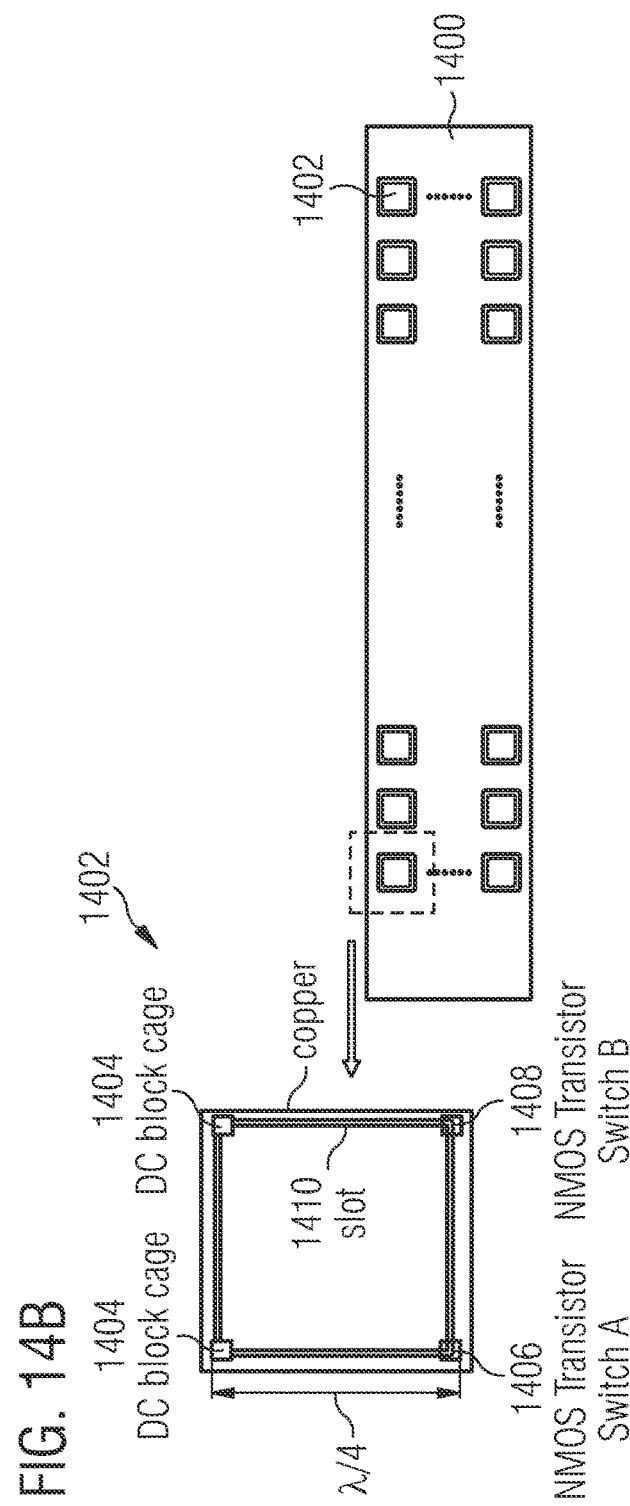
FIG. 14A
FIG. 14B

PACKAGE SYSTEM AND PACKAGE

TECHNICAL FIELD

The present disclosure relates to a package system and a package for wireless chip-to-chip communications.

BACKGROUND

Various aspects of this disclosure generally may relate to the field of wireless chip-to-chip communications.

BRIEF DESCRIPTION OF THE DRAWINGS

In the drawings, like reference characters generally refer to the same parts throughout the different views. The drawings are not necessarily to scale, emphasis instead generally being placed upon illustrating the exemplary principles of the disclosure. In the following description, various aspects of the disclosure are described with reference to the following drawings, in which:

FIG. 14A and FIG. 14B exemplarily show views of a microstrip patch array on a first layer, and a second layer of a cover 1440 a package system according to various aspect;

DESCRIPTION

Figure 1:
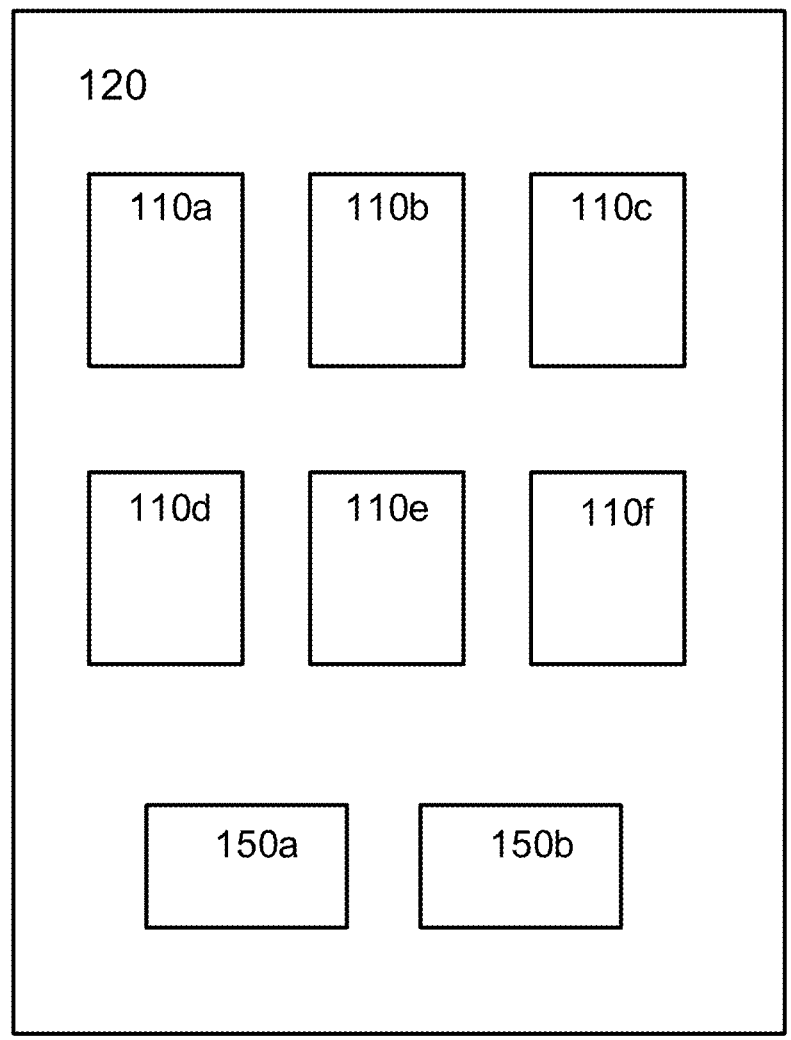
FIG. 1 exemplarily shows a simplified representation of a multi-chip electronic device.

The following detailed description refers to the accompanying drawings that show, by way of illustration, exemplary details and aspects in which aspects of the present disclosure may be practiced.

Background

Today's emerging technologies and application continue to increasingly demand or require greater computational power. Traditionally, increased computational or performance requirement could be met as a result progress reflected in Moore's law, where the number of transistors included in an integrated circuit would double approximately every eighteen months.

However, due to physical limits and constraints, the frequency of transistor doubling has slowed down. At the same time as the technologies involving artificial intelligence, machine learning, neuromorphic computing, data servers, cloud computing demands are greater with respect to computational performance. One approach to meet today's ever-increasing computational demand has been the integration of disaggregated resources in a single package or module. In some cases, the disaggregated resources may be a hardware component in the form of a chip (in various aspects a chip may be denoted as a chiplet). A chiplet can be a functional block in the form an integrated circuit that can be specifically designed to work with other chiplets to form larger more complex chips. That is, chiplets can refer to the independent constituents which make up a large chip built out of multiple smaller chiplets or dice. Chiplet(s) may be provided with or without encapsulating material packaging the chiplet(s).

Devices described herein can be in the form of a multi-chip module. Multi-chip modules described herein be an electronic assembly where multiple chiplets and/or other discrete components are integrated so that in operation, the multiple chiplets can be treated as if they were a larger integrated circuit.

The integration of disaggregated resources by way of integrating chiplets in a module may effectively bypass the limits of Moore's law and provide the computational power needed for today's applications.

However, the integration of disaggregated resource poses many challenges in terms of realizing performance improvement, cost efficiency, and design flexibility. For example, the connections between the chiplets or other functional blocks in a module can provide difficulties and challenges.

General Framework

Conventionally, a wireless channel between communicatively coupled die packages is susceptible to multiple reflections between chassis and main board (printed circuit board, PCB) of the die packages. The free space path loss decay rate can also be significant, e.g. proportional to $1/r^2$. Conventionally, to overcome multipath problems, a more directive beam is desired. Further, the directive beam may create a channel that is more immune to multipath problems. A directive beam may also introduce less phase error, and consequently may require less equalization taps and power. Further, a directive beam may also simplify a signal decoding and may improve the latency.

Conventionally, to serve multiple direction communication requirements, a beam scanning capability is much desired. In this case, a phase array may be used for beam scanning. However, a phase array may not be applicable for wireless package-to-package communication due to the large footprint, high cost, and high complexity of the phase array.

Various aspects address the multipath problems in a more simple and robust manner. Illustratively, in various aspects, a metallic cover, e.g. a chassis or integrated heat spreader (IHS), of a package-to-package communication system is configured at least in an area as an integrated reflector array (also denoted as reflectarray), e.g. including an array that acts as an integrated reflector array. In various aspects, depending on the specific application, the reflectarray can be configured reconfigurable or fixed, as described in more detail below.

As an example, the metallic cover may include a patterned flexible carrier which may be conformally attached to a metallic chassis, to form at least one of a reconfigurable, fixed, or hybrid reflectarray. This way, a directive wireless package-to-package communication may be realized.

In various aspects, a reconfigurable reflectarray may include at least one of an N-bit phase shift structure or one or more varactor diodes. A varactor diode may also be denoted as varactor, varicap, varicap diode, variable capacitance diode or tuning diode. In various aspects, using the varactors, the phase shifting of the reconfigurable reflectarray may be continuous.

Further, this way, multipath reflection may be reduced, and, hence, a transmission distance in wireless package-to-package communication may be increased. Further, this way, less equalization taps may be required, and, thus, signal decoding may be reduced and latency may be improved.

Further, the reflectarray may not require additional space on the package carrier, and, hence, cost of the package may be low.

Further, direct current power consumption of the package-to-package communication system may be low and band width of wireless communications may be relatively wide.

FIG. 1 shows a simplified representation of a multi-chip electronic device 100. The device 100 includes a plurality of chiplets 110a-f. Each of the chiplets 110a-f may include one or a plurality of processor cores or cores. In addition to the chiplets 110a-f, the electronic device 100 may include other hardware and/or software resources as represented by the blocks 150a and 150b. For example, the electronic device 100 may include elements or components such as, for example, processors (e.g., CPU, GPU, AI engine, etc.), random access memory (RAM), read-only memory (ROM), erasable programmable ROM (EPROM), electrically erasable programmable ROM (EEPROM), application specific integrated circuit (ASIC), etc.), software, hardware, firmware.

The device 100 may include a base layer or a carrier 120 (also denoted as package carrier) for mounting on which the chiplets and other components can be mounted. In some cases, the carrier 120 may be a printed circuit board (PCB) including wired connections between the components, e.g., wired connections between the chiplets and wired connections for the resources 150a-b. One or more package carriers can be arranged on another common carrier (also denoted as board).

The device 100 of FIG. 1 can be considered as 2D (two-dimensional) device because the components are mounted on a single plane. However, the above approach may be of less value because area of the mounting plane (e.g., real estate) may not be sufficient to allow enough components for a particular application. Further, the connections of a base layer like a PCB (e.g., conductive traces) may be unsuitable for applications requiring a structure with fast interconnections.

Figure 2:
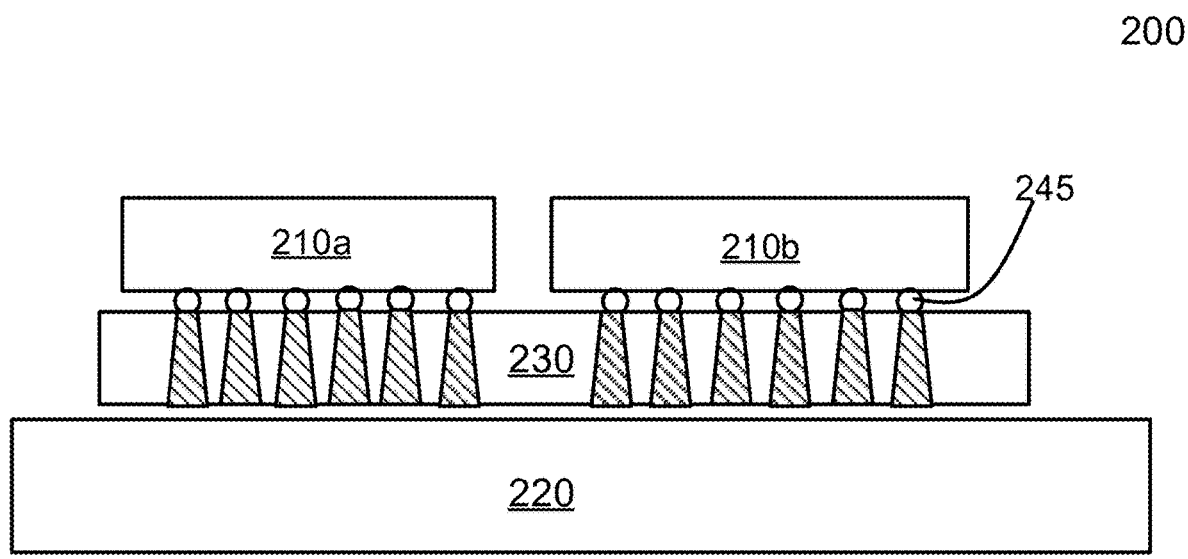
FIG. 2 exemplarily shows another architectural approach for increasing computational power using 2.5-dimensional package.

Another architectural approach for increasing computational power is the use of 2.5 dimensional (2.5 D) packages. One example of a 2.5D package is shown in the device 200 of FIG. 2. Conventional 2.5D packages may include multiple components, e.g., chips or chiplets mounted on an interposer. Conventionally, 2.5D semiconductor package place several chips side-by-side on a silicon interposer. This can be seen in FIG. 2, where in the device 200, chips or chiplets 210a and 210b are mounted using bumps 245 on an interposer 230. The interposer 230 itself can be mounted on the base layer or package carrier or carrier 220.

An interposer is an electrical interface between connectors. For example, an interposer can provide interconnections between the components (e.g., chips, chiplets, etc.), as well as the external input/outputs (I/O) through the use of through carrier vias or Through-Silicon-Vias (TSV). Interposers can be silicon interposers that have lateral dimensions larger than the chips or components they are interconnecting.

Further, 2.5D package devices may also include bridges. For example, silicon bridges are a small piece of silicon that can be embedded under the edges of two components and provide interconnections therebetween. This can allow for most chips or components to be attached in multiple dimensions and thus eliminating additional physical constraints on heterogeneous chip attachment within the theoretical limits. In other words, embedded multi-die interconnect bridge (EMIB) or bridges are essentially embedded into a standard package carrier and are used to provide high interconnect density exactly where needed, while the rest of a standard package carrier can be used for the rest of the interconnects.

Another architectural approach for improving such a device is the use of three-dimensional (3D) stacking of semiconductor devices or components. The components (e.g., chips or chiplets) can be arranged in 3 dimensions instead of 2 dimensions. This allows the components of a device or module to be placed in closer proximity to one another.

Figure 3:
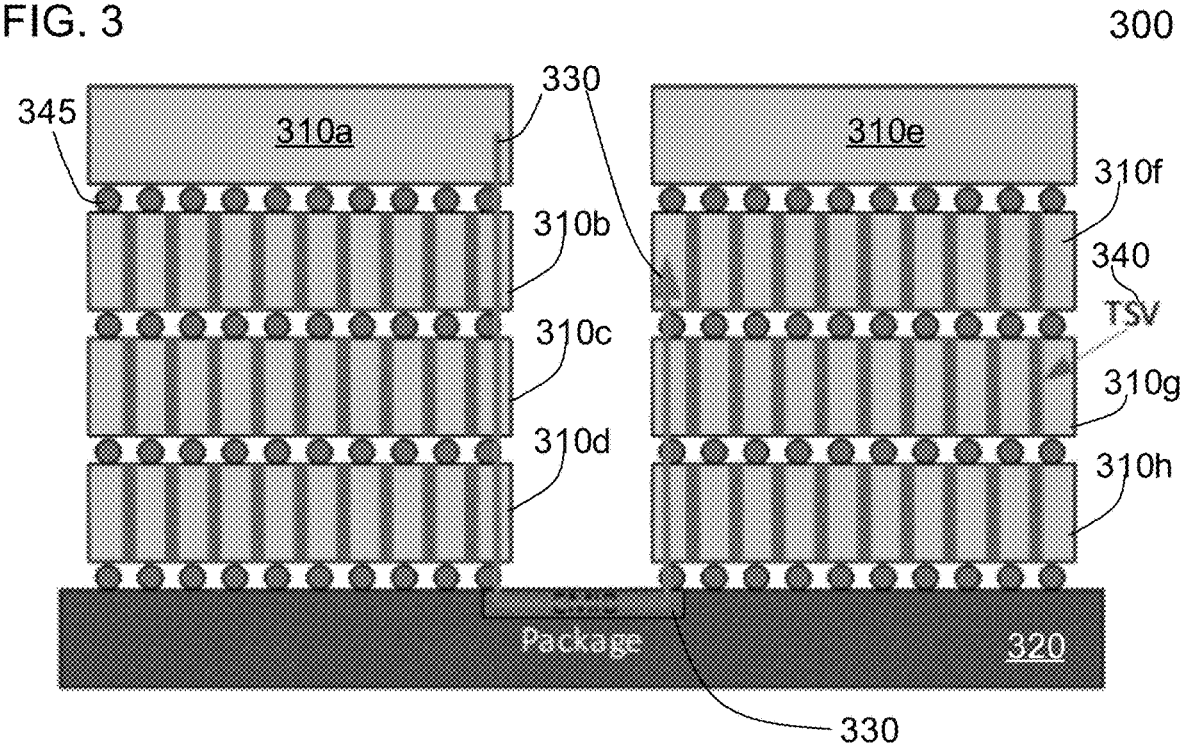
FIG. 3 and FIG. 4 exemplarily show example of a module device of an 3D heterogeneous integration of integrated circuits or components.
Figure 4:
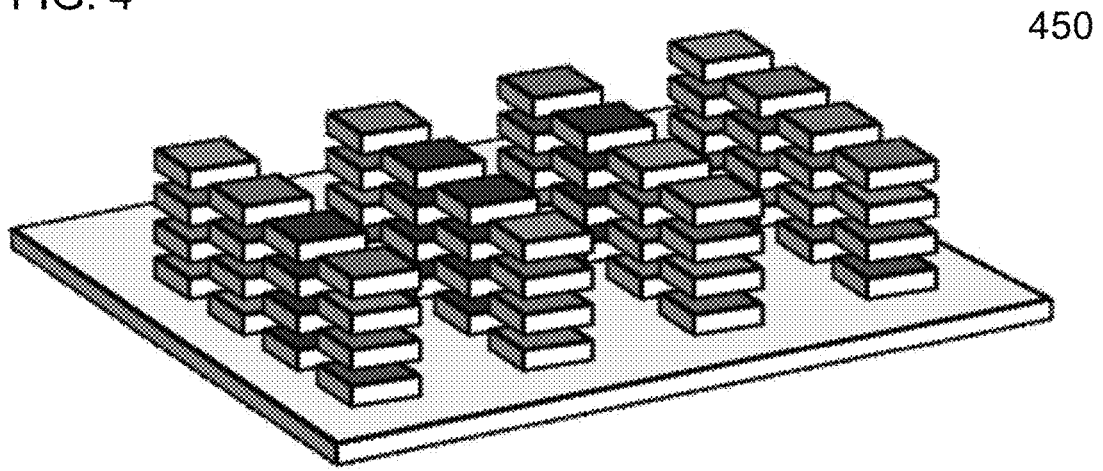

The module device 300 of FIG. 3 and FIG. 4 is one example of a 3D heterogeneous integration of integrated circuits or components (e.g., chiplets). The device 300 integrates disaggregated components in vertical stacks. The device includes at least a first vertical stack of chiplets 310a-d and a second vertical stack of chiplets 310e-h. In some examples, the chiplets 310a-310h may be any type of hardware component, e.g., include any type of processor (e.g., CPU, GPU, etc.), AI engine, accelerator, memory, or other suitable or desired component. As shown, the vertically adjacent chiplets 310a-310h are connected to one another using TSVs 340 and bumps 345. Further, the package carrier 320 providing a mount for each stack can further include a bridge 330 for connecting the vertical stacks of chiplets. Specifically, the bridge 330 can directly connect the lower chiplet/component 310d of one stack with the lower chiplet/component 310h of the second stack. One example of a bridge is an embedded multi-die interconnect bridge (EMIB).

3D integration may provide improved speed between components (e.g., chips) as average wire length becomes shorter, and thus leading to shorter propagation delay and improved overall performance. 3D heterogonous integrated devices may be built with a Manhattan-like architecture which includes large X-Y arrays of heterogeneous chiplets (e.g., CPU, GPU, AI, memory, etc.) and each chiplet can be positioned like in the chess board having several stacked dice. FIG. 4 depicts a device 450 which is an MCM implemented with a Manhattan architecture. The vertical dimension allows for greater connectivity and more design possibilities. Further, the 3D heterogeneous integration of resources may provide devices that provide improved performance while consuming lower power due to shorter wires which lead lower power consumption and less parasitic capacitance. Reducing the power budget leads to less heat generation, extended battery life, and lower cost of operation.

Nevertheless, the above-mentioned technologies do not scale well for massive 3D integration because the data rate per line may only be 2 to 10 Gbps. For example, referring structure to the wired interconnection approach for the device 300, no chiplets or components other than the lower two chiplets 310d and 310h have a direct connection. Therefore, if the chiplet 310a needs to connect and communicate with the chiplet 310f, the data path 330 would have to be one that runs through the TSVs 340 of the chiplets 310b-310 on the first stack, through the EMIB 330, and then through the TSVs 340 of the chiplets 310g and 310h before arriving at the chiplet 310f. Therefore, communication between chiplets would often require the use of many connections. As more and more components are added which need to communicate with each other, the more the traffic in the TSVs, EMIBs, interposers, etc. increases. This increase in traffic presents problems in cases where high-transport data connections are needed.

For example, to create an aggregate data transport of 1 Tbps, 100 to 500 interconnect lines would be needed. While such data transports may be accomplished for communication between neighboring structure chips, it would be physically and economically unfeasible to provide such data transports for larger integrations that involve hundreds of interconnect lines between horizontally and vertically stacked chips.

Further, the cost of a silicon interposer is proportional to the area of that interposer. So, in cases needing several or many localized high-density interconnects, the costs can quickly accumulate.

In short, TSV silicon interposers are relatively expensive and do not scale well for applications that require a massive number of components e.g., chiplets. Further, wires (interconnects) that connect together chips or chiplets degrade in performance with scaling. That is, wires can dominate the performance, functionality and power consumption of ICs.

Wireless Chip-to-Chip interconnect is an approach for realizing high-speed data transport that would meet the requirements for high-performance computing products and applications. The wireless chip-to-chip (WC2C) technology can complement wired communications. WC2C can provide additional flexibility for high-performance computing products by enabling broadcast and multipoint-to-multipoint links with significant advantages to dynamically reconfigurable data-center networks.

Figure 5:
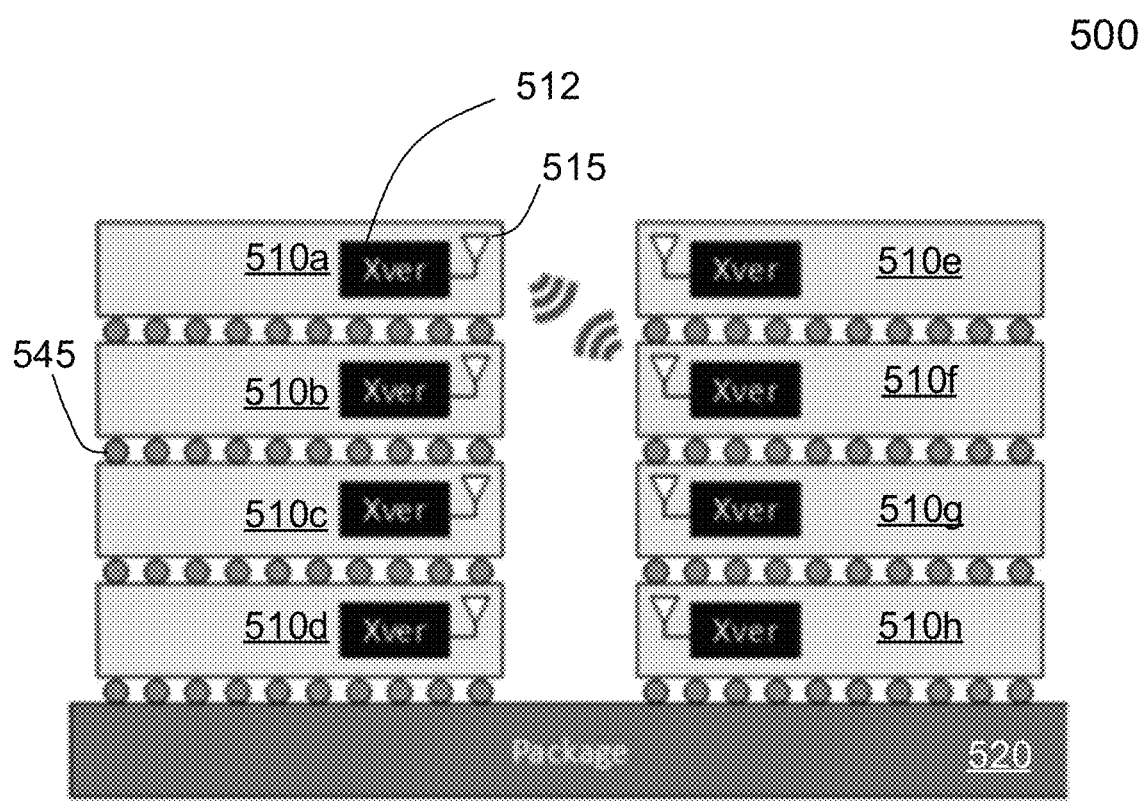
FIG. 5 exemplarily shows an example of a multi-chip module incorporating wireless interconnections.

FIG. 5 shows an example of a multi-chip module (MCM) 500 incorporating wireless interconnections. The multi-chip module 500 includes a 3D integration of disaggregated resources (e.g., chiplets 510a-h).

The chiplets 510 can be stacked and mounted on a package carrier 520. To enable wireless connection, each chiplet 510 or component can include an antenna or antenna structure 515 and radio circuitry, e.g., transceiver circuitry 512. In addition, module 500 can include or provide wired communication between components. Similar to the module 300 of FIG. 3, the chiplets 510 may include TSVs (not shown) and bumps 545 that can allow for vertical interconnection. Further, the package carrier 520 can include bridges (e.g., EMIBs) and other types of interconnects or routing lines for providing connections between components.

WC2C communication may be used for dense chiplet based products and supplement existing chip to chip communications, e.g., wired interconnections. As shown in the example of FIG. 5, the chiplet 510a can directly communicate wirelessly with the chiplet 510f. Therefore, in aspects of the present disclosure, the use of WC2C communication can be used to greatly relieve or reduce the data traffic through TSVs, interposers, or bridges and improve device performance, efficiency and allow for greater and more massive 3D heterogeneous integration.

According to aspects of the present disclosure, to implement WC2C communication, a multi-chip module such as the module 500 may implement protocols that can be divided into control plane and data plane.

The data plane carries the network data (e.g., in-module data) in accordance with the directives of the control plane. That is, the data plane performs the actual forwarding of the data according to the configuration or routing paths managed and set forth by the control plane.

In at least some cases, the data plane of WC2C communications may operate with frequencies in the 110-170 GHz D-band using CMOS circuits with economic power efficiency. For example, in some aspects, the antennas may have approximately 1 mm of spacing. As CMOS technology continues to evolve and improve, higher frequencies, the reduction of the size and spacing of antenna elements, and higher bandwidths can be realized.

The modules implementing WC2C communication can include control plane capabilities. That is, to augment the above-mentioned high-speed wireless data links or the data plane, control plane capabilities or functionalities can be included in the modules. Control plane functions implemented using wireless control signaling can establish the wireless data connections described herein. The control plane protocols can be used to establish wireless connections within a module or package and further to define routing paths for the data. For example, industry protocols, including Wi-Fi, I²C, USB, and/or other known protocol may be used.

Figure 6:
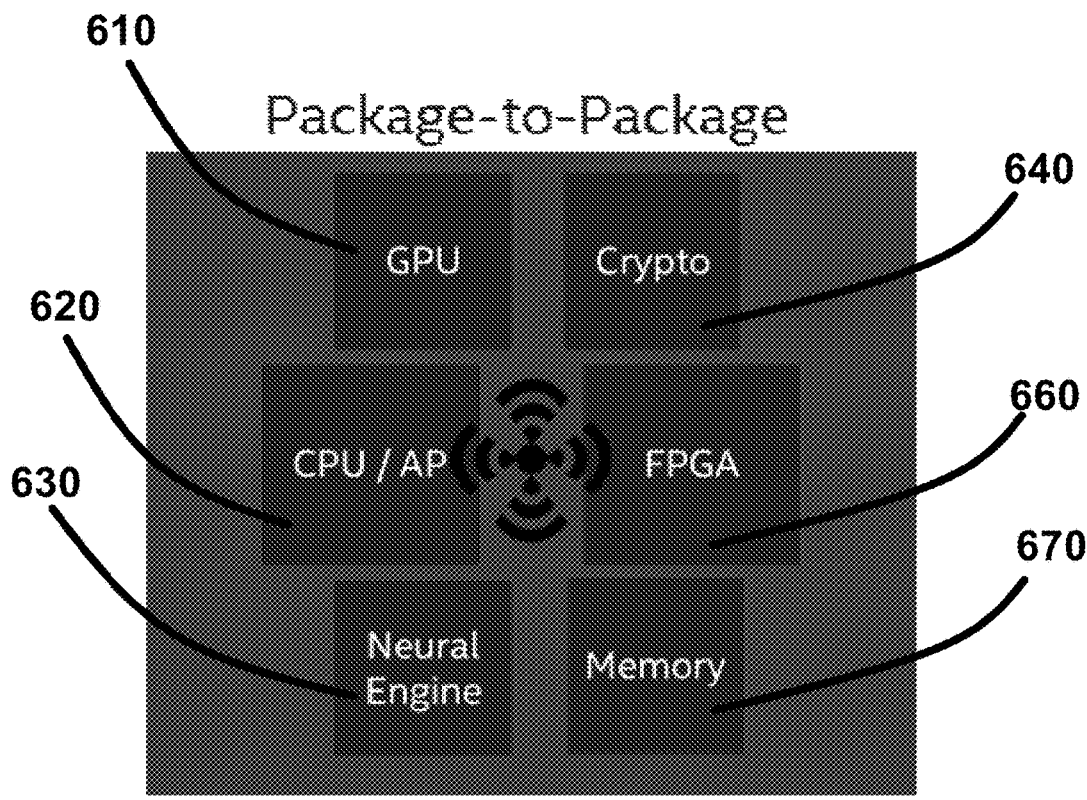
FIG. 6 exemplarily shows a schematic example of a package according to various aspects.

Control plane messages or control signaling may be in the form of packets to inform other components on where to forward data or data messages. In some aspects, the control plane messages of a multi-chip module may be implemented by using frequencies that differ from the data or data plane messages to manage and configure network data or data being transmitted to and from the components of a multi-chip device. In some cases, the messages may be implemented in a package-to-package type of communication scheme. For example, as described herein, a multi-chip device may include components that have their own individual packaging. (This is in contrast to a multi-chip module of chiplets which may be packaged together (e.g., the dice of the chiplets share a common package). In such cases, the multi-chip device may include wireless package-to-package communications. This is the scenario illustrated in FIG. 6, where in the device 600, the several components (GPU 610, CPU 620, Neural Engine 630, Cryptoprocessor 640, Field-programmable gate array (FPGA) 660, Memory device 670) have their own packaging which includes wireless circuitry to implement wireless package-to-package communications.

The control plane may manage communication not only for traffic within a multi-chip package (also denoted as in-package communication), but also may manage the communication between modules or packages e.g., multi-chip modules or packages.

Figure 7:
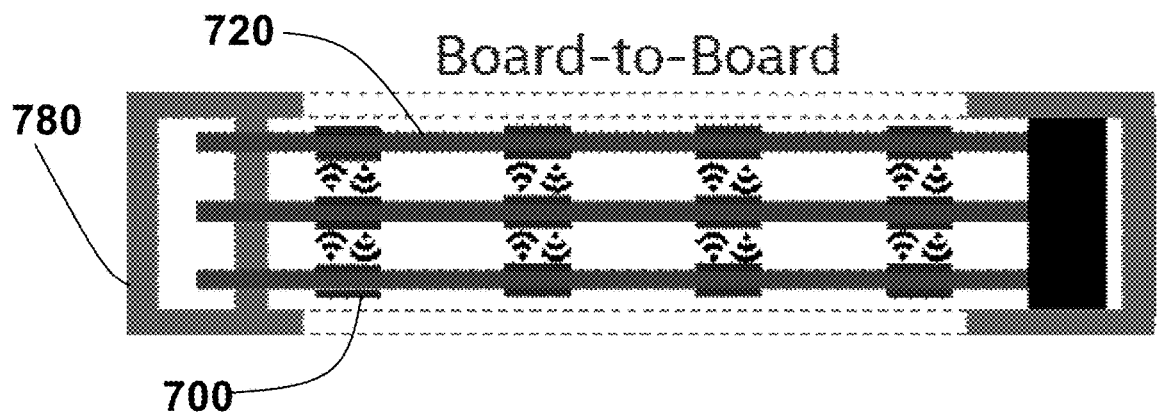
FIG. 7 exemplarily shows board-to-board communications according to various aspects.

This type of communication may be considered as wireless package-to-package communications. Furthermore, the control plane may be used for facilitating board-to-board communications illustrated in FIG. 7. That is, the devices or MCMs 700 described herein can be mounted on boards, such as boards 720, which in turn may be housed in a rack unit, such as rack unit 780. In board-to-board communication, wireless communication may occur between the mounted devices 700 (e.g., MCMs) of different boards 720.

Figure 8:
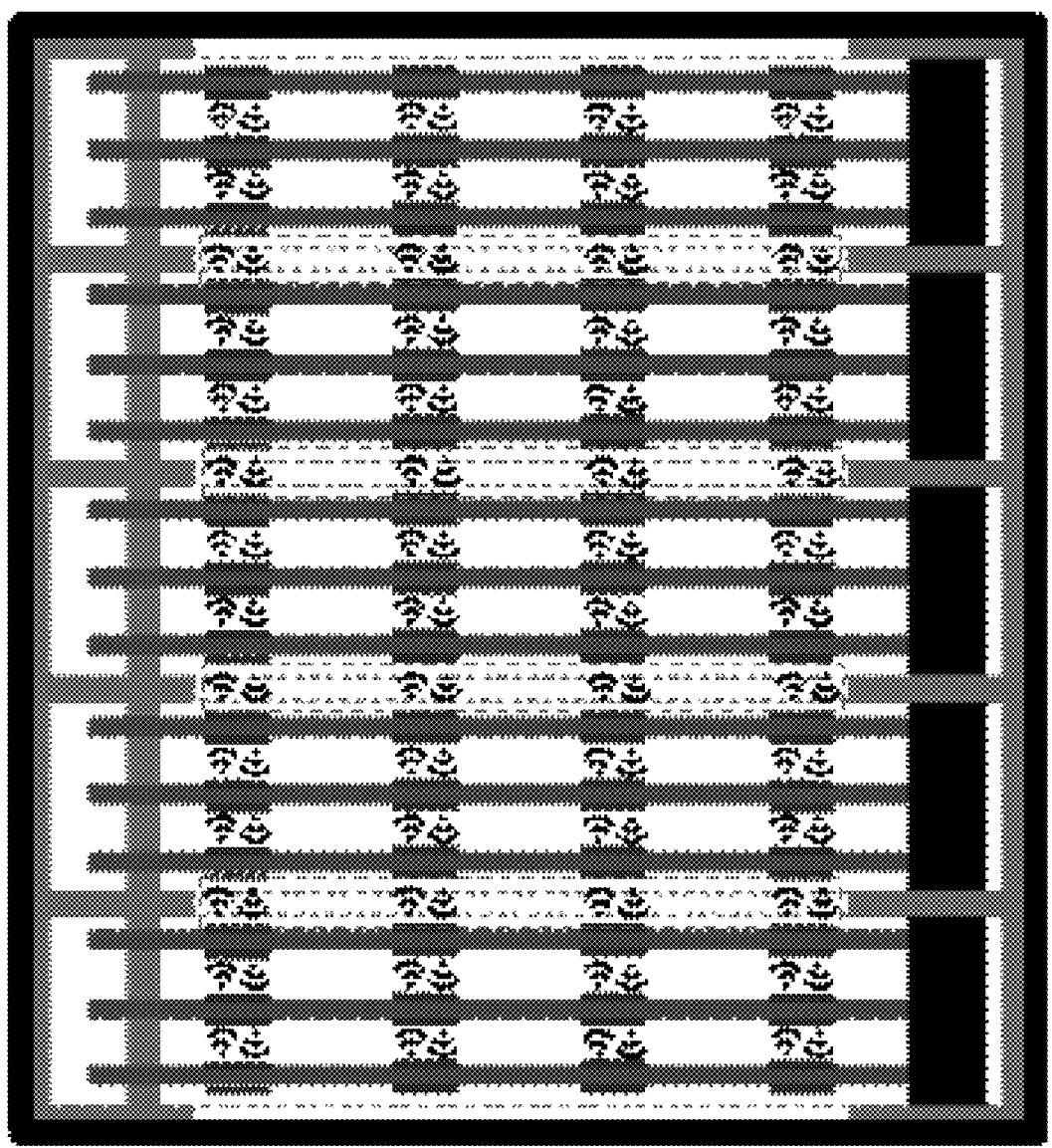
FIG. 8 exemplarily shows wireless communication extended to rack unit-to-rack unit communication.

In addition, FIG. 8 shows that wireless communication may be extended to rack-unit-to-rack-unit communication, e.g., within a chassis 810 of the rack 800.

In aspects of the present disclosure, control plane circuitry can be provided in dice of a multi-chip module and configured to provide control plane functions for wireless communication network involving devices (e.g., MCMS), dices, and packages described herein. The control plane circuitry may operate or use, as an example sub-10 GHz RF carrier technology to enable point-multipoint, broadcastable, full-duplex wireless control/manageability links for various scenarios, e.g., board-board, package-package, and chiplet-to-chiplet within a package, type communications. Control signaling may be in the form of packets reflecting any suitable type of control plane protocol. The control plane circuitry may be integrated in an application-specific manner in a module. Components of the control plane circuitry such as the transceiver circuitry or the antenna structure may be integrated or incorporated with any part of a multi-chip module described herein. Further, aspects or components of the control plane circuitry such as the antenna, connections, or waveguides, may also be included or incorporated into other components holding or involving multi-chip modules, such as boards, chassis, racks, etc.

According to aspects of the present disclosure, sub-10 GHz technology may be used for control signaling. Operation at sub-10 GHz can allow for process portability and easy adoption of the radio frequency (RF) transceiver and may use near-field couplers/antennas. The flexibility of an RF link can allow convenient placement and use within a product chassis, from rack-unit-to-rack-unit, and for 3D heterogeneously integrated semiconductor products. For example, in at least some aspects of the present disclosure, control signaling bit rates may be in the range of 0.5-2 Gbps over distances up to 20 cm, supporting both symmetric and asymmetric topologies. The distance may decrease with increasing frequency, e.g. for a frequency of up to about 100 GHz the distance may be in the range of about 1 cm.

Figure 9:
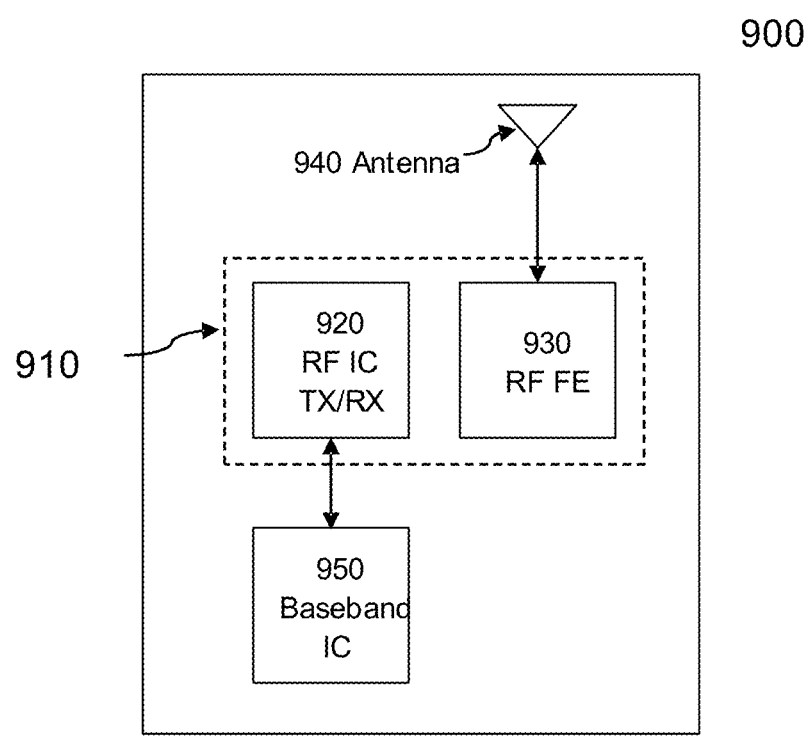
FIG. 9 exemplarily shows a block diagram showing a wireless device according to various aspects.

For the WC2C communications, both the data plane and control plane require the use of an RF circuitry. FIG. 9 shows a block diagram showing a wireless circuitry 900. The wireless circuitry 900 includes a hardware component, e.g., a baseband integrated circuit 950 for baseband signal processing, a radio circuitry 910 for radio frequency signal processing, and an antenna or antenna structure 940.

The radio circuitry 910 may include an RF integrated circuit (IC) 920 including one or more RF transceivers (TRX) and a common RF front end (FE) 930. The RF IC 920 may receive one or more data and control signals (also denoted as signal of the control plane of the OSI model) and operate to receive a communication signal from the baseband IC and generate an RF electrical signal from the communication signal for radio transmission from the circuitry 900 or receive an RF electrical signal and generate a communication signal from the RF electrical signal for providing to the baseband IC. The RF FE 930 may convert an RF electrical signal into a format for transmission via the antenna 940 and/or convert a signal received from the antenna 940 into an RF electrical signal for the RF IC 920.

Figure 10:
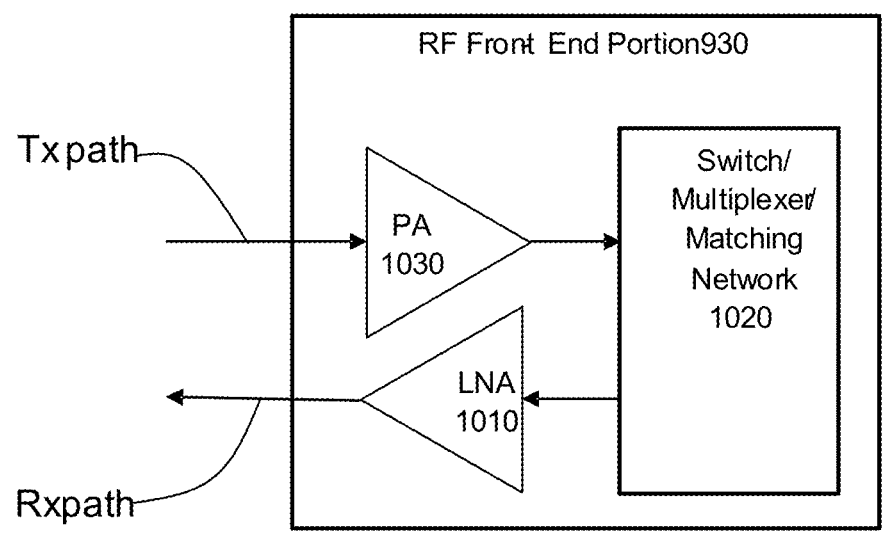
FIG. 10 exemplarily shows an example of a RF front-end portion implemented in the device according to various aspects.

FIG. 10 shows an example of an RF front end portion 930 that may be implemented in the circuitry 900. A receive signal path (Rx path) of the RF front end 930 of FIG. 10 includes an LNA (low noise amplifier) 1010 for amplifying received RF signals and provides the amplified received RF signals as an output. A transmit signal path (Tx path) of the RF front end 930 of FIG. 10 includes a PA (power amplifier) 1030 for amplifying input RF signals. One or more filters may be included for generating suitable RF signals for transmission and reception. In addition, the RF front-end 930 of FIG. 10 may include other components 1020 or circuitry, such as, for example, a tuner or matching network, switches, multiplexers, and/or another circuitry for coupling the RF front end 930 to an antenna 940 as illustrated in FIG. 9. In addition, other components may be included to support both transmit and receive modes.

The RF FE 930 of at least FIG. 9 can provide signals obtained from the antenna 940 to the RFIC 920. The transceiver chain or RFIC 920 can interface between the RF FE 930 and one or more other components.

Figure 11:
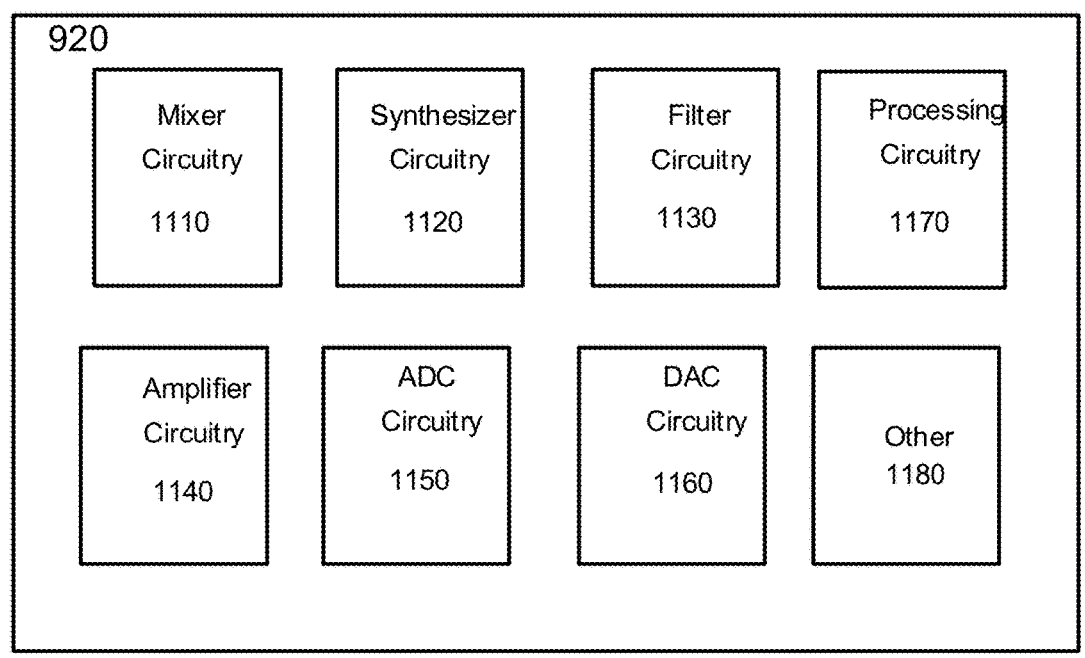
FIG. 11 exemplarily shows one example of the RF IC or transceiver circuitry according to various aspects.

FIG. 11 shows one example of the RFIC or transceiver circuitry 920. As shown, the transceiver chain/RFIC 920 can include components such as a mixer circuitry 1110, synthesizer circuitry 1120 (e.g., local oscillator), filter circuitry 1130 (e.g., baseband filter), amplifier circuitry 1140, analog-to-digital converter (ADC) circuitry 1150, digital-to-analog (DAC) circuitry 1160, processing circuitry 1170, and other suitable digital front end (DFE) components 1180, to name a few. The processing circuitry 1170 may include a processor, such as a time-domain and/or frequency domain processor(s)/components in at least one example.

The other components 1180 may include logic components, modulation/demodulation elements, and an interface circuitry for interfacing with another component.

DFE (digital front end) components 1180 may include any suitable number and/or type of components configured to perform functions known to be associated with digital front ends. This may include digital processing circuitry, portions of processing circuity, one or more portions of an on-board chiplet having dedicated digital front-end functionality (e.g., a digital signal processor), etc. The DFE components 1180 may selectively perform specific functions based upon the operating mode of the radio circuitry 910 and, for example, may facilitate beamforming. Digital front-end components may also include other components associated with data transmission such as, for instance, transmitter impairment correction such as LO correction, DC offset correction, IQ imbalance correction, and ADC skew, digital pre-distortion (DPD) calculation, correction factor (CF) calculation, and pre-emphasis (pre. emp.) calculation. To provide additional examples, the digital front-end components 1180 may facilitate or perform receiver or transmitter digital gain control (DGC), up-sampling, down-sampling, zero crossing detection algorithms, phase modulation, perform beam management, digital blocker cancellation, received signal strength indicator (RSSI) measurements, DPD and calibration accelerators, test signal generation, etc.

In at least one example, the transceiver chain (of the RF IC 920) can include a receive signal path which may include mixer circuitry 1110, amplifier circuitry 1140 and filter circuitry 1130. In some aspects, the transmit signal path of the transceiver chain 920 may include filter circuitry 1130 and mixer circuitry 1110. The transceiver chain 920 may also include synthesizer circuitry 1120 for synthesizing a frequency signal for use by the mixer circuitry 1110 of the receive signal path and the transmit signal path. In some aspects, the mixer circuitry 1110 of the receive signal path may be configured to down-convert RF signals received from the RF FE 930 based on the synthesized frequency provided by synthesizer circuitry 1120.

In some aspects, the output baseband signals and the input baseband signals may be digital baseband signals. In such aspects, the radio circuitry 910 may include analog-to-digital converter (ADC) 1150 and digital-to-analog converter (DAC) circuitry 1160.

In at least one example, the transceiver chain 920 may also include a transmit signal path (Tx path) which may include circuitry to up-convert baseband signals provided by e.g., a modem and provide RF output signals to the RF FE 930 for transmission. In some aspects, the receive signal path may include mixer circuitry 1110, amplifier circuitry 1140 and filter circuitry 1130. In some aspects, the transmit signal path of the RFIC 920 may include filter circuitry 1130 and mixer circuitry 1110. The RFIC 920 may include synthesizer circuitry 1120 for synthesizing a frequency signal for use by the mixer circuitry 1110 of the receive signal path and the transmit signal path. The mixer circuitry 1110 of the receive signal path may be configured to down-convert RF signals received from the RF FE 930 based on the synthesized frequency provided by synthesizer circuitry 1120.

In various aspects, amplifier circuitry 1140 may be configured to amplify the down-converted signals and filter circuitry may be a low-pass filter (LPF) or band-pass filter (BPF) configured to remove unwanted signals from the down-converted signals to generate output baseband signals. Output baseband signals may be provided to another component for further processing. In some aspects, the output baseband signals may be zero-frequency baseband signals, although this is not a requirement.

The mixer circuitry 1110 for a receive signal path may include passive mixers, although the scope of this disclosure is not limited in this respect. In some aspects, the mixer circuitry 1110 for a transmit signal path may be configured to up-convert input baseband signals based on the synthesized frequency provided by the synthesizer circuitry 1120 to generate RF output signals for the RF FE 930.

In some aspects, the mixer circuitry 1110 of the receive signal path and the mixer circuitry 1110 of the transmit signal path may include two or more mixers and may be arranged for quadrature down conversion and up conversion, respectively. In some aspects, the mixer circuitry 1110 of the receive signal path and the mixer circuitry 1110 of the transmit signal path may include two or more mixers and may be arranged for image rejection (e.g., Hartley image rejection). In some aspects, the mixer circuitry 1110 of the receive signal path and the mixer circuitry 1110 may be arranged for direct down conversion and direct up conversion, respectively. In some aspects, the mixer circuitry 1110 of the receive signal path and the mixer circuitry 1110 of the transmit signal path may be configured for super-heterodyne operation.

In some aspects, the synthesizer circuitry 1120 may be a fractional-N synthesizer or a fractional N/N+1 synthesizer, although the scope of the aspects is not limited in this respect as other types of frequency synthesizers may be suitable. For example, synthesizer circuitry 1120 may be a delta-sigma synthesizer, a frequency multiplier, or a synthesizer including a phase-locked loop with a frequency divider.

The synthesizer circuitry 1120 may be configured to synthesize an output frequency for use by the mixer circuitry 1110 of the radio circuitry 1120 based on a frequency input and a divider control input. In some aspects, the synthesizer circuitry 1120 may be a fractional N/N+1 synthesizer.

In some aspects, frequency input may be provided by a voltage-controlled oscillator (VCO), although that is not a requirement. In various cases, divider control input may be provided by a processing component of the RFIC 920, or may be provided by any suitable component. In some aspects, a divider control input (e.g., N) may be determined from a look-up table based on a channel indicated by external component.

In some aspects, synthesizer circuitry 1120 of the RFIC 920 may include a divider, a delay-locked loop (DLL), a multiplexer and a phase accumulator. In some aspects, the divider may be a dual modulus divider (DMD) and the phase accumulator may be a digital phase accumulator (DPA). In some aspects, the DMD may be configured to divide the input signal by either N or N+1 (e.g., based on a carry out) to provide a fractional division ratio. In some aspects, the DLL may include a set of cascaded, tunable, delay elements, a phase detector, a charge pump and a D-type flip-flop. The delay elements may be configured to break a VCO period up into Nd equal packets of phase, where Nd is the number of delay elements in the delay line. In this way, the DLL provides negative feedback to help ensure that the total delay through the delay line is one VCO cycle.

In some aspects, synthesizer circuitry 1120 may be configured to generate a carrier frequency as the output frequency, while in other aspects, the output frequency may be a multiple of the carrier frequency (e.g., twice the carrier frequency, four times the carrier frequency) and used in conjunction with quadrature generator and divider circuitry to generate multiple signals at the carrier frequency with multiple different phases with respect to each other. In some aspects, the output frequency may be a LO frequency (fLO). In some aspects, the RFIC 920 may include an IQ/polar converter.

Figure 12:
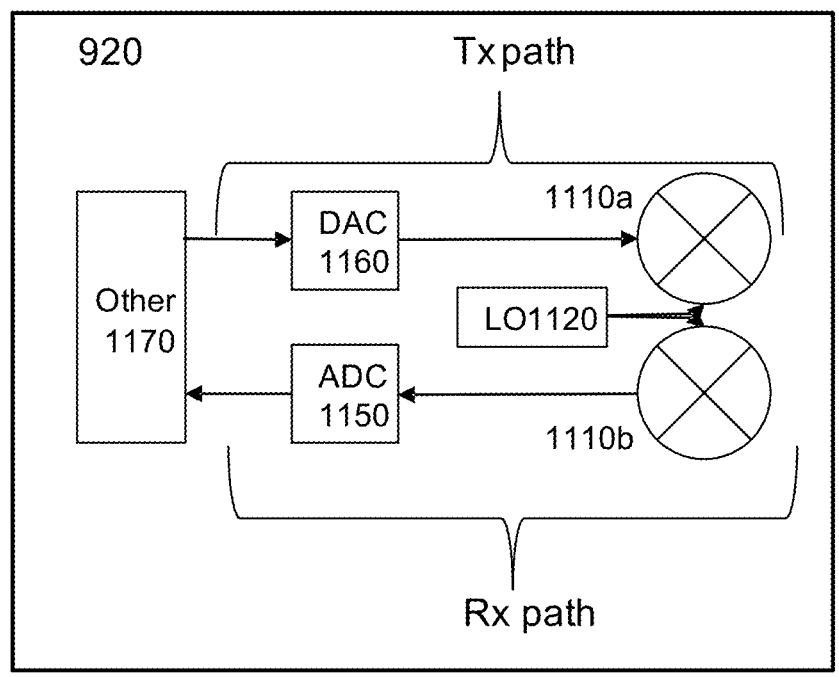
FIG. 12 exemplarily shows one example of the RF IC or transceiver circuitry according to various aspects.

FIG. 12 shows one example of a transceiver chain/RFIC 920 that may be implemented. The receive signal path (Rx path) circuitry down-converts RF signals received from the RF FE 930 and provides baseband signals. Specifically, the receive signal path may include a mixer 1110*b* and an ADC 1150. The transmit signal path (Tx path) circuity up-converts provided baseband signals and provides RF output signals to the RF front end 930 for transmission. Specifically, the transmit signal path may include a DAC 1160 and a mixer 1110*a*. The transceiver chain shown in FIG. 12 includes a synthesizer circuit, specifically, at least one local oscillator (LO) 1120 to generate reference signals for the mixers 1110*a* and 1110*b*.

The antenna 940, illustrated in FIG. 9, may include a single antenna for transmission and reception. In other cases, the antenna or antenna structure 940 may include multiple transmit antennas in the form of a transmit antenna array and multiple receive antennas in the form of a receive antenna array.

In other cases, the antenna 940 may be one or more antennas to be used as transmit and receive antennas. In such cases, the RF FE 930 may include, for example, a duplexer, to separate transmitted signals from received signals.

While the transceivers described herein include traditional super-heterodyning schemes or architectures, other type of transceiver or transmitter architectures and schemes may be used. In some aspects, the transceiver chain of the RFIC 920 may include components so as to implement a near zero IF scheme, a Direct Conversion scheme, or a digital transmission schemes, such as, for example, a Digital IQ transmission, a Digital Polar transmission, and the like.

In one example, the transceiver chain of the RFIC 920 may include a transmit path that includes or implements a direct digital transmitter (DDT). That is, in one simple example, a DDT may include a digital signal processor, a RF digital-to-analog converter (RFDAC), a RF filter/antenna coupler.

Further, a DDT may be implemented with or without an IQ-mixer. In general, a RF-DAC may be included on a RFIC to convert digital input into a RF signal. A DDT may include other digital components such as numerically controlled oscillator (NCO) and digital mixers for shifting an input signal to desired frequency. The use of a DDT can reduce the number of analog components needed in the transmitter or transmit path. For example, an analog LOs, analog filters, analog mixers, and etc., may be eliminated from the RFIC when a direct digital transmitter such as DDT is employed. Further, the use of a digital transmitter or digital transmission schemes such may bring structure energy savings and efficiencies.

Usually, wireline interconnects, such as silicon interposers and embedded multi-die interconnect bridge (EMIB) are used for connecting chips. However, wireline interconnect lacks the flexibility of broadcasting and multi-drop. Further, directive wireless communication using phase array or other beamforming network (BFN) are used for device-to-device communication. However, phase array or other BFN may lead to higher power consumption, larger package area, and higher cost.

Figure 13:
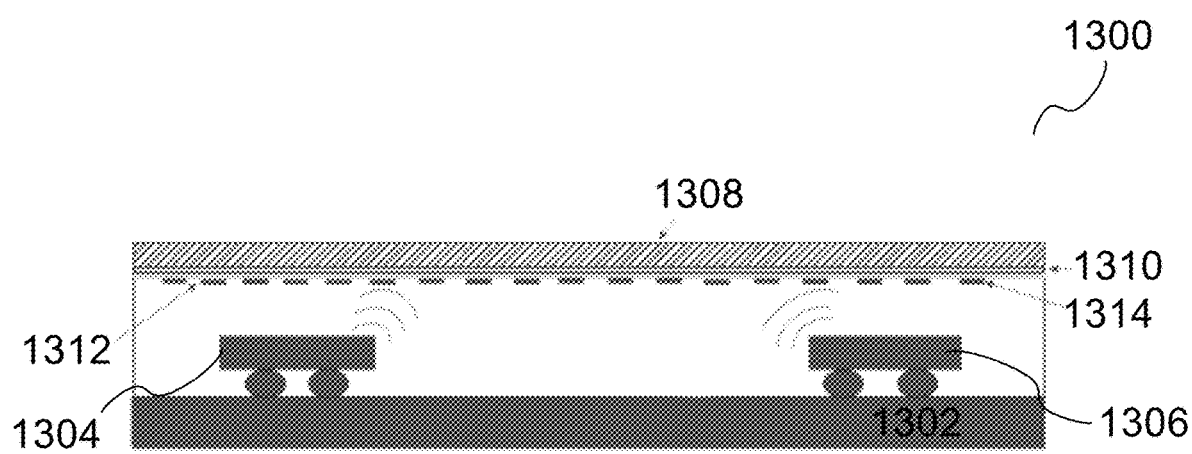
FIG. 13 exemplarily shows a package-to-package communication system according to various aspects.

FIG. 13 illustrates a package-to-package communication system 1300 (also denoted as package system) according to various aspects. Here, a first package 1304 and a second package 1306 may be arrange on a common carrier 1302, and may be covered by a common cover 1308. The cover 1308 may be a housing structure, e.g. a chassis or a housing of a rack or a rack unit, or an integrated heat spreader (IHS), for example. Each of the first package 1304 and the second package 1306 may have an antenna as described above. The first package 1304 and the second package 1306 may be wirelessly communicatively coupled by a radio frequency signal interface utilizing the antennas of the first package 1304 and the second package 1306. The cover 1308 may be configured to include a reflector array 1314. The reflector array 1314 may be integrated, embedded or attached to a carrier of the cover 1308. As an example, the reflector array 1314 may be preassembled and attached to the surface of a metallic carrier of the cover 1308. The reflector array 1314 is facing the first package 1304 and the second package 1306 that are wirelessly communicatively coupled.

In various aspects, a radio frequency absorbing structure (not illustrated) may be configured to laterally enclose the first package 1304 and the second package 1306, e.g. along four sides of a rectangular cover 1308. Illustratively, the radio frequency absorbing structure may form or be part of a Faraday cage.

In various aspects, the cover 1308 may include a multi-layer structure 1310, 1312, 1314 of frequency selective surfaces (FSS) that form the reflector array 1314. The multilayer structure 1310, 1312, 1314 may be printed out on a flexible carrier 1310 attached to a carrier of the cover 1308 according to various aspects. In various aspects, the multi-layer structure 1310, 1312, 1314 may be conformably attached to the top surface of the metallic cover of the package system 1300. The layers of the flexible carrier may have at least one of one or two dielectric layers 1312.

In the flexible carrier 1310, an electronic switch may be at least one of embedded, integrated in or printed out on the flexible carrier for reconfigurability.

The flexible carrier 1310 may include or be formed of a material having a relative dielectric permittivity in a range of about 3 to 6. The flexible carrier 1310 may be coated or glued to the surface of the carrier of the cover 1308.

Conventionally, with respect to a reflector array, a feed antenna in the far field is required. However, differing from the conventional reflector array, electromagnetic energy, e.g. radio frequency signals to be transmitted, generated by a package edge antenna may be coupled to the reflector array in a near field or radiative near field.

FIG. 14A and FIG. 14B illustrate views of a microstrip patch array 1430 on a first layer 1420, and a second layer 1400 of a cover 1440 of a package system according to various aspect. In various aspects, a plurality of 1-bit phase shift structures 1402 may be embedded or arranged on the second layer 1400 for each unit cell, e.g. beneath each patch of the microstrip patch array 1430. Each 1-bit phase shift structure 1402 may include a first NMOS transistor switch 1406 and a second NMOS transistor switch 1408. Direct current blocks 1404 may be arranged in a distance of λ/4 from the NMOS transistor switches 1406, 1408, and may be connected via a slot 1410 with the NMOS transistor switches 1406, 1408. In other words, a first layer (L1) 1420 of the carrier of the cover may include a frequency selective surface (FSS) made of a microstrip patch array 1430, as illustrated in FIG. 14A, and the phase of the reflected radio frequency signal may be adjusted via the 1-bit phase shift structures 1402 illustrated in FIG. 14B. As an example, the FSS on the first layer L1 1430 receives a radio frequency signal (also denoted as RF wave) launched by an edge antenna of a package of the package system. The FSS reflector re-transmits the collimated wave by the FSS. The size of the patch and the period of the patch in the microstrip patch array 1430 may dictate the resonant frequency of the FSS. While the aspect illustrated in FIG. 14A and FIG. 14B includes patches having a square shape, the structures forming the reflector array can assume other shape, e.g. a patch is one of the examples. In general, an arbitrary-shape of a "patch" or an antenna can be applied as long as the 1-bit phase shifter can be integrated with the patch/antenna. Thus, the term "patch" may refer to a planar antenna structure.

Figure 15:
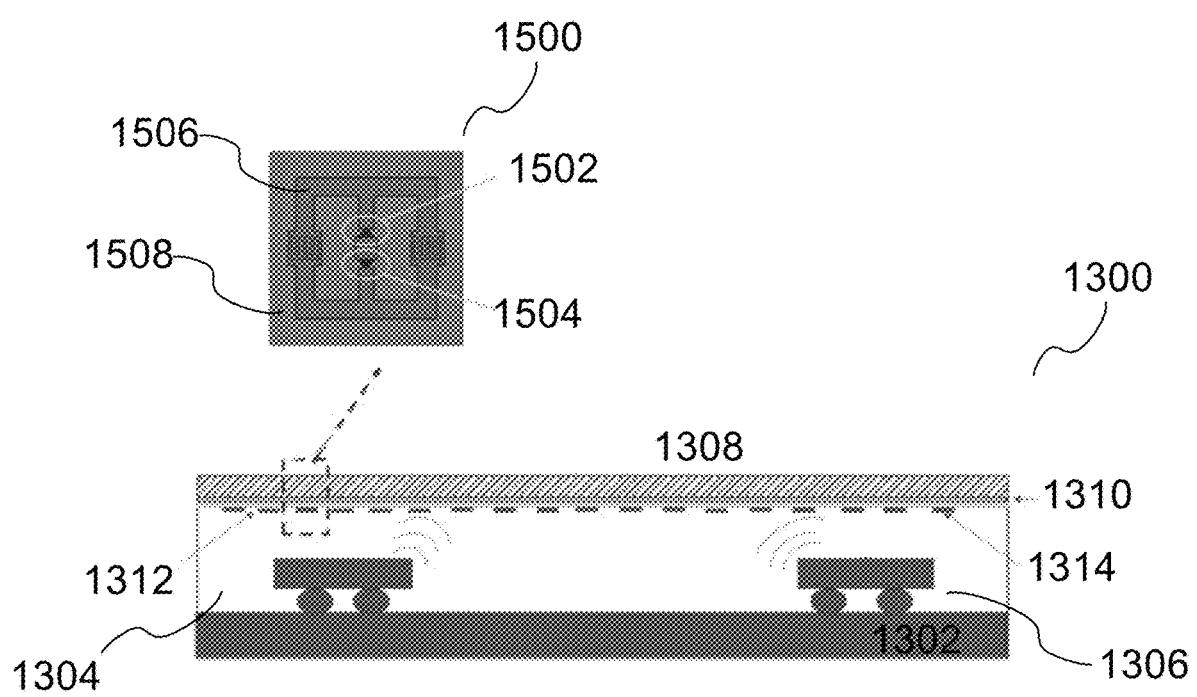
FIG. 15 exemplarily shows a schematic top view of a unit cell of an array of reconfigurable 1-bit phase shifters on a second layer of a cover of a package system according to various aspects.

FIG. 15 illustrates a schematic top view of a unit cell 1500 (also denoted as patch) of an array of reconfigurable 1-bit phase shifters on a second layer (L2) of a cover of a package system 1300 according to various aspects. A circuit 1506 of the unit cell that form the reflective patch of the reflector array 1314 may be printed out on the second layer (L2) 1312, 1508 of a flexible carrier 1310, as an example. In the example illustrated in FIG. 15, the phase shifting may be electronically controlled by a first varactor 1502 and a second varactor 1504 and, hence, be reconfigurable. Here, using the varactors 1502, 1504, the phase shifting can be continuous. A slot line may be arranged on the ground plane on L2 1508 depending on which switch A, B 1502, 1504 may be switched on. Thus, the phase shifter may offer one of θ=0° or θ=180° phase shifting.

Figure 16:
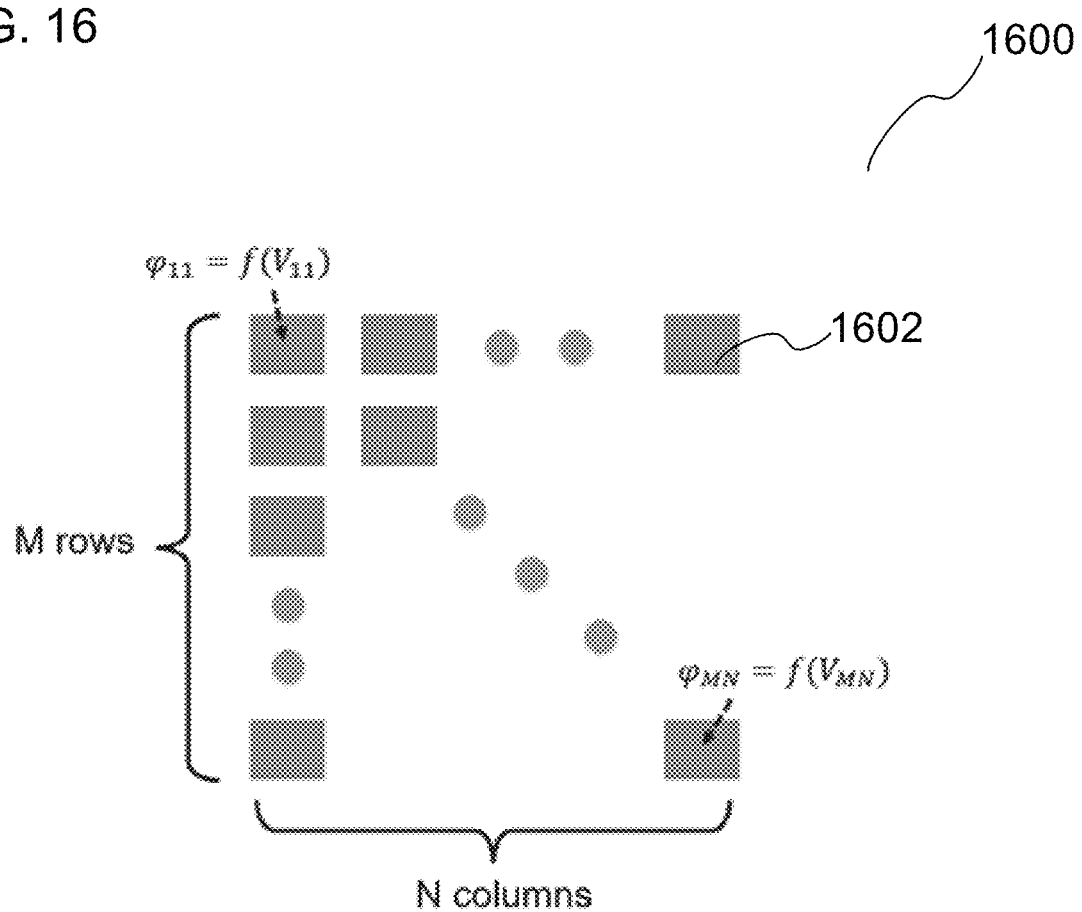
FIG. 16 exemplarily shows a schematic view of a cover integrated reflector array with continuous phase shifting according to various aspects.

FIG. 16 illustrates a schematic view of a cover integrated reflector array 1600 with continuous phase shifting according to various aspects. In this example, the reconfigurable unit cell 1602 of the integrated reflector array may be printed on a second layer L2 of the flexible carrier with two varactor diodes. This way, a higher phase shifting range may be achieved. In various aspects, a bias network is provided based on a row and column based bias network.

In a reconfigurable reflector array, a single control line for each individual phase shifter or other phase-shifting mechanism may be used. This way, there will be M×N control lines. However, when it comes to a very large M×N array, thousands of control lines on the flexible carrier may be used for routing. Thus, using the cover of the integrated reflector array for wireless package-to-package communication could be challenging.

Figure 17:
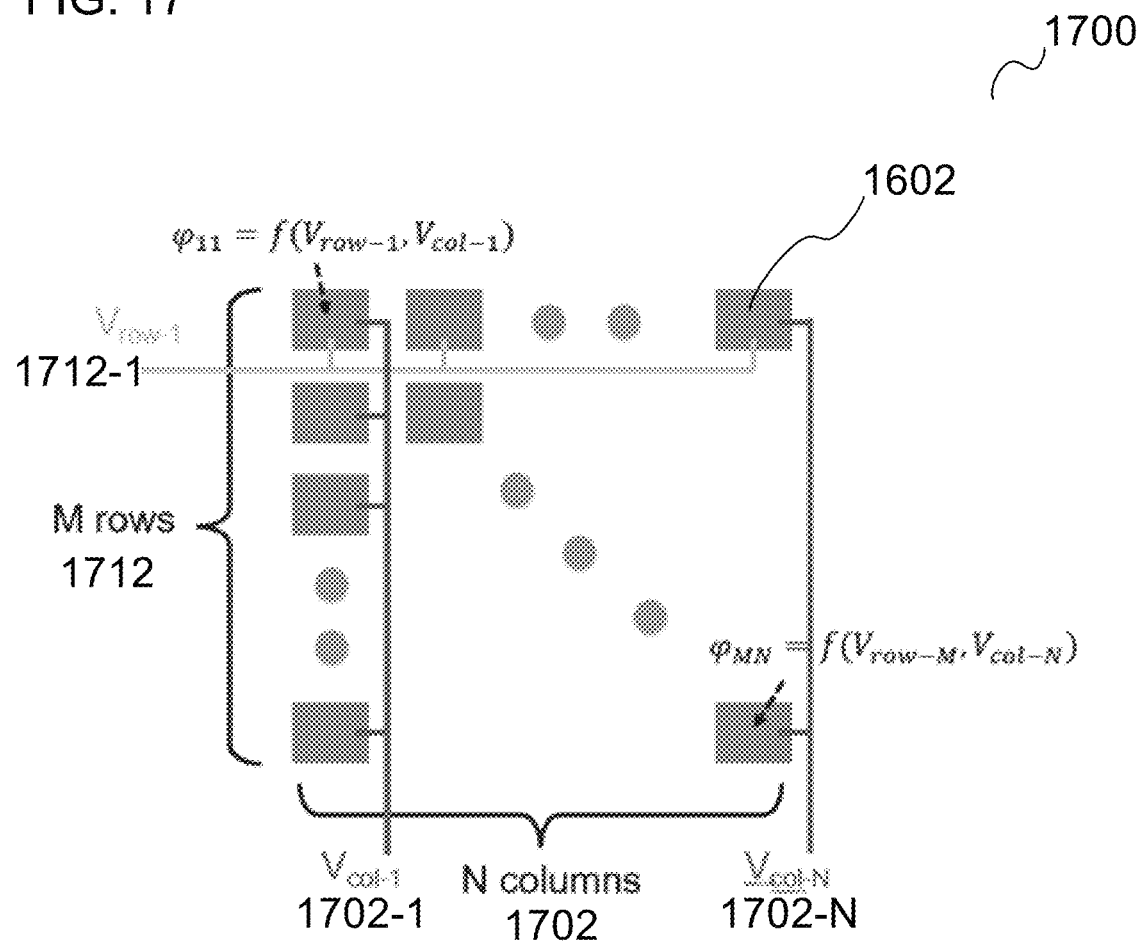
FIG. 17 exemplarily shows a top view of a control method for an M×N array element according to various aspects.
Figure 18:
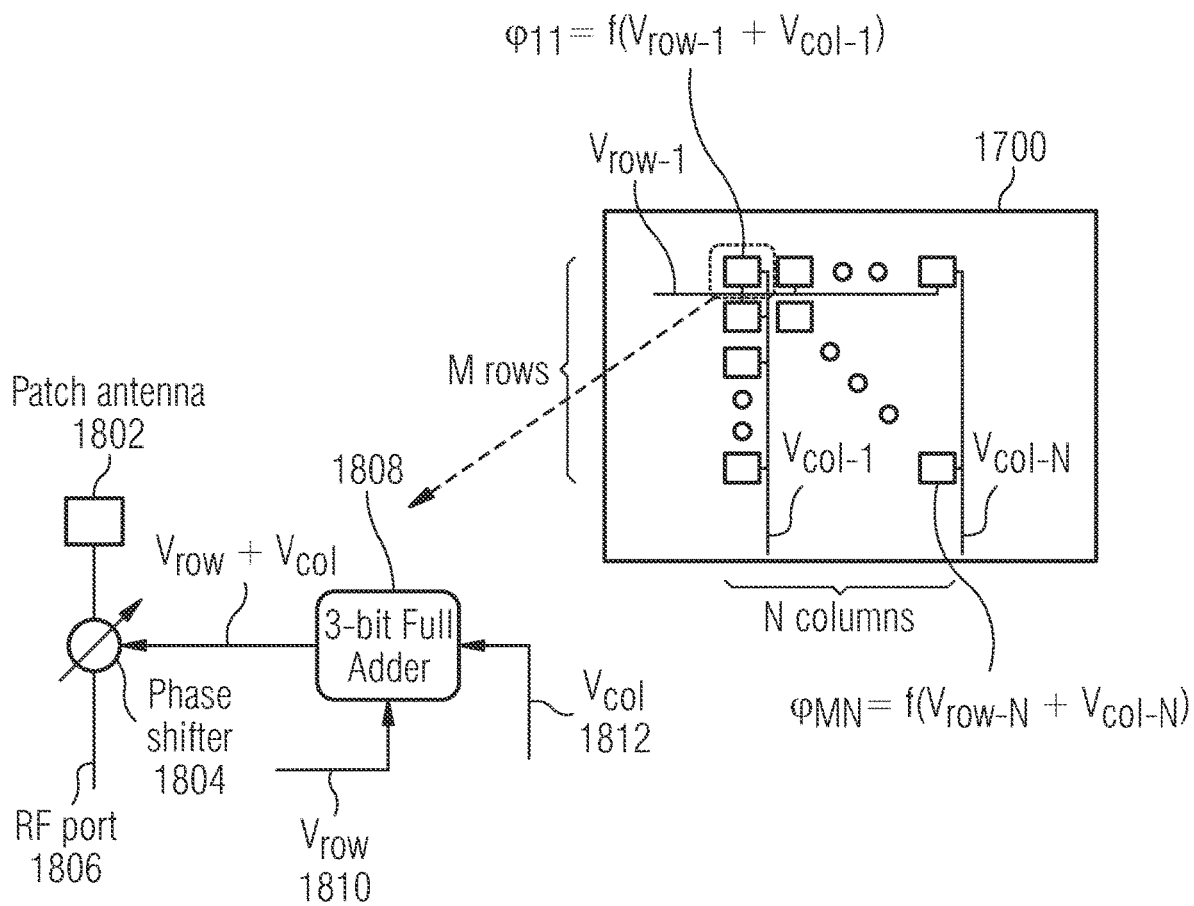
FIG. 18 exemplarily shows an example of a cover including a 3-bit phase shifter according to various aspects.

In various aspects, the package-to-package communication system may include a phase control having one more variable. This way, each element 1602 (also denoted as unit cell) of the M×N array arranged in M rows 1712 and N columns 1702 may have a first control line 1712-1 and a second control line 1702-1, 1702-N, as illustrated in FIG. 17 and FIG. 18. FIG. 17 illustrates a top view of a control method for an M×N array element according to various aspects. Here, each element at the same row (or alternatively column) 1712-1 of the M×N array may share the same control input, as illustrated in FIG. 17. Hence, the number of control line number may be decreased to M+N instead of M×N. This way, the routing complexity of the communication system and the overall flexible carrier dimension may be reduced. The function f(x,y), with x as row number and y as column number, can be of any operation, e.g., addition, subtraction, linear, nonlinear, etc.

FIG. 18 illustrates an example of a cover including a 3-bit phase shifter column and row enabled control including a 3-bit full adder 1808 having inputs for a first voltage Vrow 1810 and a second voltage Vcol 1812. A combined voltage (Vrow+Vcol) is supplied from the 3-bit full adder 1808 to a phase shifter 1804. The phase shifter 1804 is coupled to a radio frequency port 1806 and a patch antenna 1802.

Figure 19:
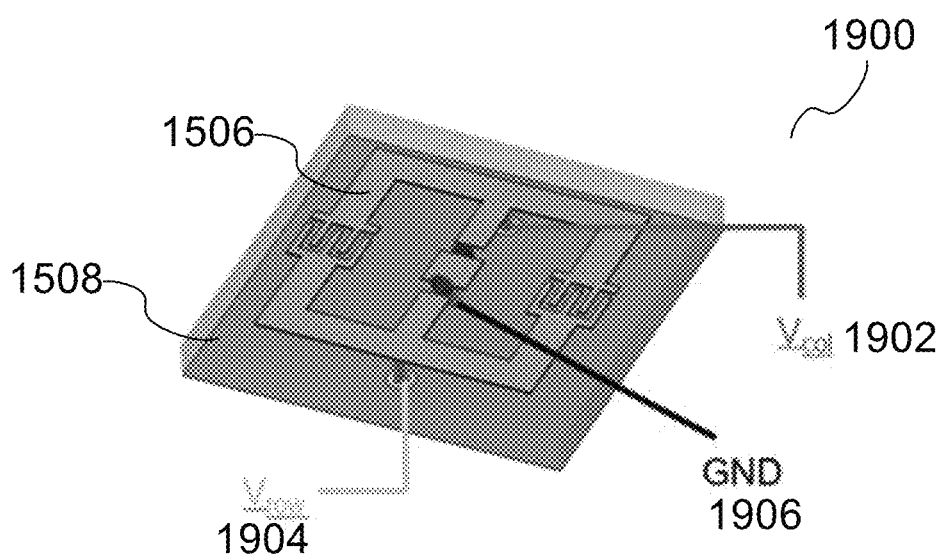
FIG. 19 exemplarily shows an example of a reconfigurable unit cell of a reflector array according to various aspects.

FIG. 19 illustrates an example of a reconfigurable unit cell 1900 of a reflector array, the reconfigurable unit cell 1900 having a first control line 1904, e.g. coupled to Vrow, and a second control line, e.g. coupled to Vcol 1902, according to various aspects. The reconfigurable unit cell is configured to accept a first input voltage and a second input voltage to drive a first varactor and a second varactor, see also FIG. 15.

Figure 20A:
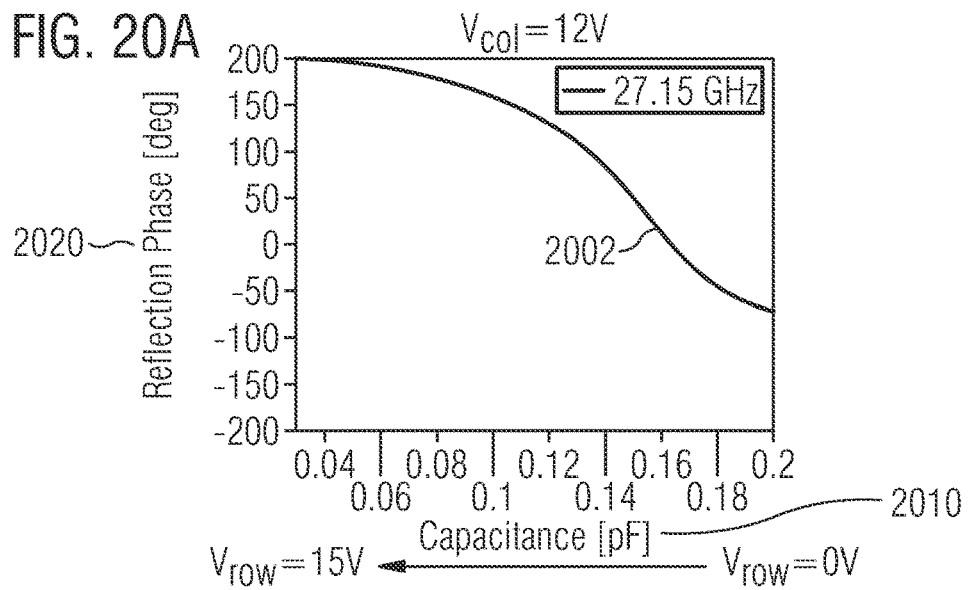
FIG. 20A to FIG. 20C exemplary show the change of reflection phase using different input voltage levels according to various aspects.
Figure 20B:
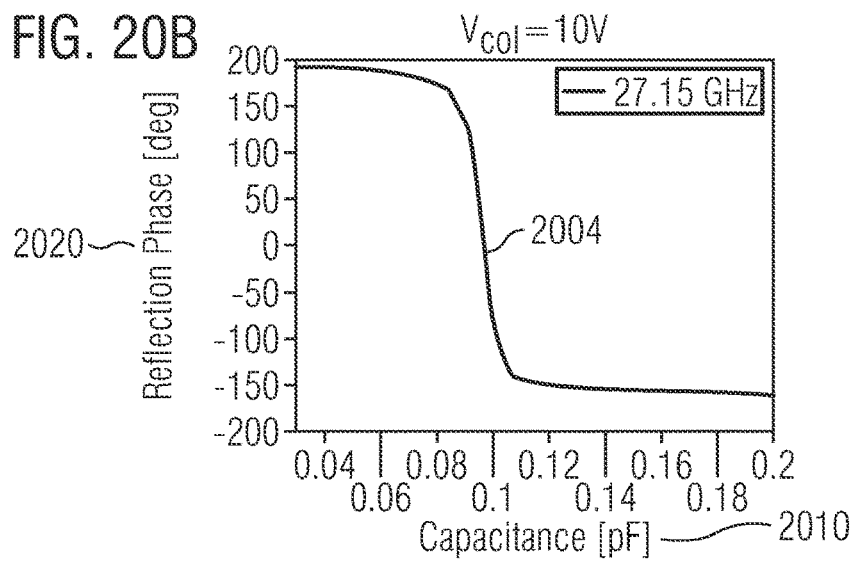
Figure 20C:
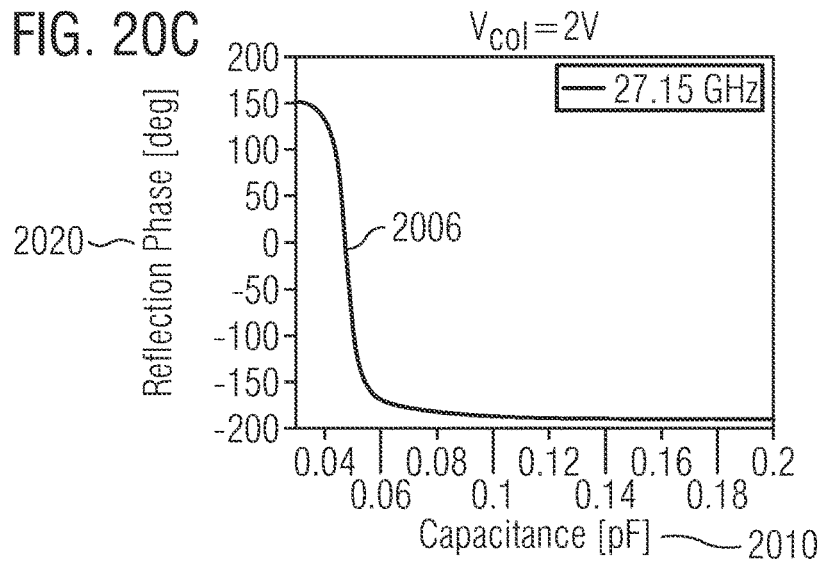

FIG. 20A to FIG. 20C illustrate the change of reflection phase using different input voltage levels Vcol being 12V 2002 (FIG. 20A), Vcol being 10 V 2004 (FIG. 20B) and Vcol being 2 V (FIG. 20C). The reflection phase 2020 is illustrated as a function of capacitance 2010 for the voltage sweep of Vrow from 0 V to 15 V. The voltage applied to the control line of the row (Vrow) is sweeped from 0 V to 15 V with corresponding capacitance from 0.2 pF to 0.03 pF. FIG. 20A to FIG. 20C reveal a nonlinear characteristic, e.g. a none linear phase shifting, by applying Vrow and Vcol.

Figure 21:
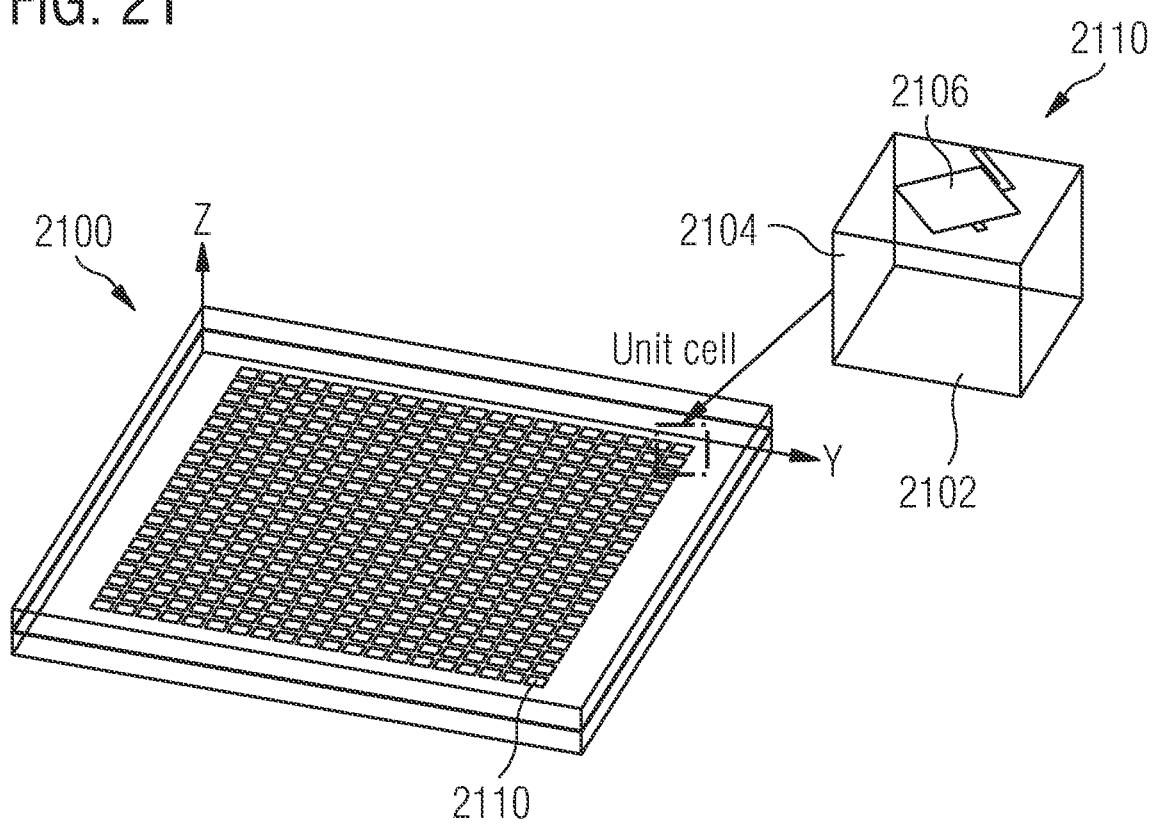
FIG. 21 exemplarily shows an example of a package with fixed direction unit cells according to various aspects.

In various aspects, the communication direction between a first package and a second package may be fixed. The reflector array may be configured with fixed direction unit cells 2100, e.g. without reconfigurable unit cells. FIG. 21 illustrates an example of a package with fixed direction unit cells 2100 according to various aspects. Each unit cell includes a patch 2106, e.g. formed as a metal structure, on a dielectric layer 2104 of a flexible carrier attached to the carrier 2102 of the cover. The size of the patch and the length of the strips of the first control line and the second control line may determine the phase shifting.

Figure 22:
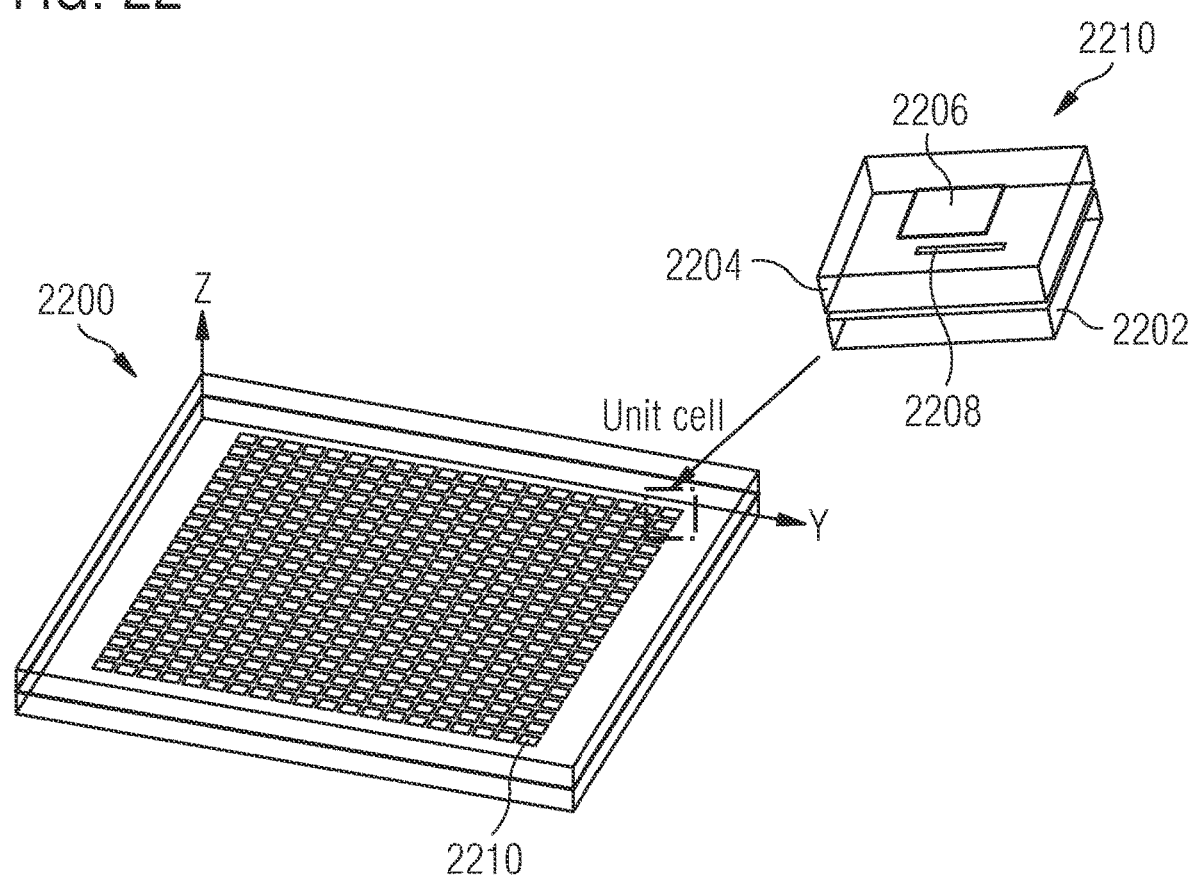
FIG. 22 exemplarily shows another example of a package system with fixed direction unit cells according to various aspects.

FIG. 22 illustrates another example of a package system 2200 with fixed direction unit cells 2210 according to various aspects. Here, the unit cell 2210 includes a first flexible carrier layer L1 2204 and a second flexible carrier layer L2 2202. A patch 2206 may be printed on the first flexible carrier layer L1 2204. A slot 2208 may be arranged on the second flexible carrier layer L2 2202. The patch size and the slot dimension may determine the phase shifting for each unit cell 2210.

Figure 23:
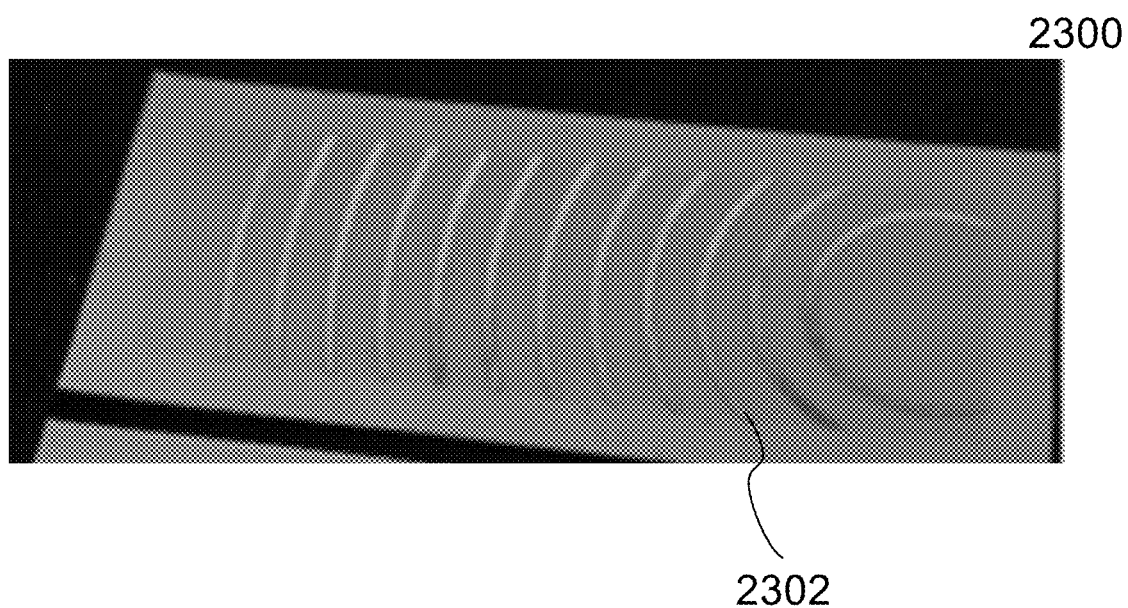
FIG. 23 exemplarily shows another example of a package with fixed direction unit cells according to various aspects.

FIG. 23 illustrates another example of a package with fixed direction unit cells according to various aspects. Here, the unit cell includes a holographic pattern 2302.

Figure 24:
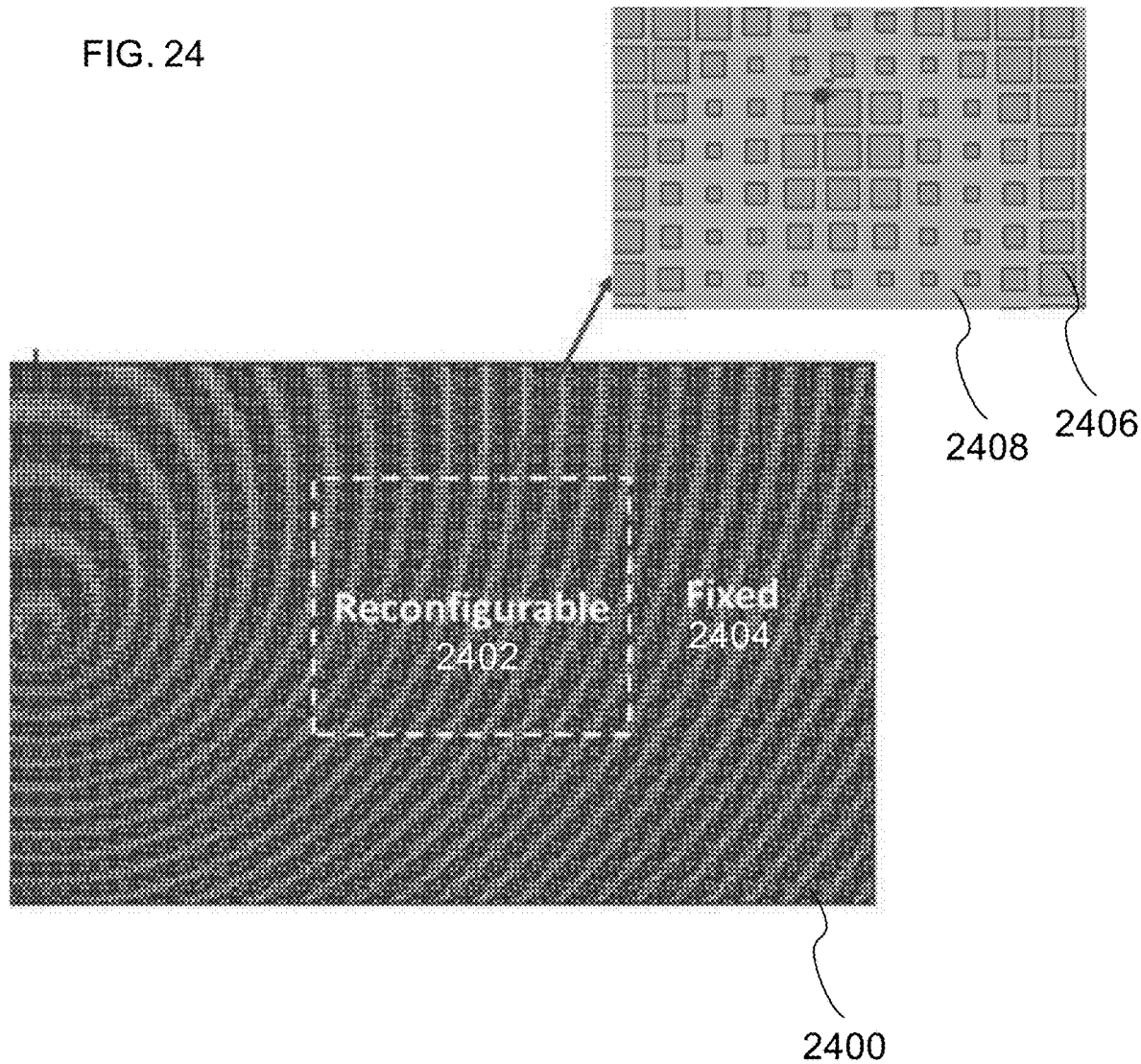
FIG. 24 exemplarily shows a schematic top view of a hybrid reflector array of a cover of a package-to-package communication system according to various aspects.

In various aspects, the cover includes an integrated hybrid reflector array of reconfigurable unit cells 2402 and fixed unit cells 2404. FIG. 24 illustrates a schematic top view of a hybrid reflector array of a cover of a package-to-package communication system according to various aspects. Here, only a portion of a holographic pattern area 2408 may be laterally enclosed by rectangular shaped structure 2406 that may be made reconfigurable configured. Each patch unit cell may have an electronically controllable phase shifting mechanism. The electronically controllable phase shifting mechanism may be formed as described above. The electronically controllable phase shifting mechanism may be arranged underneath of each patch.

Figure 25:
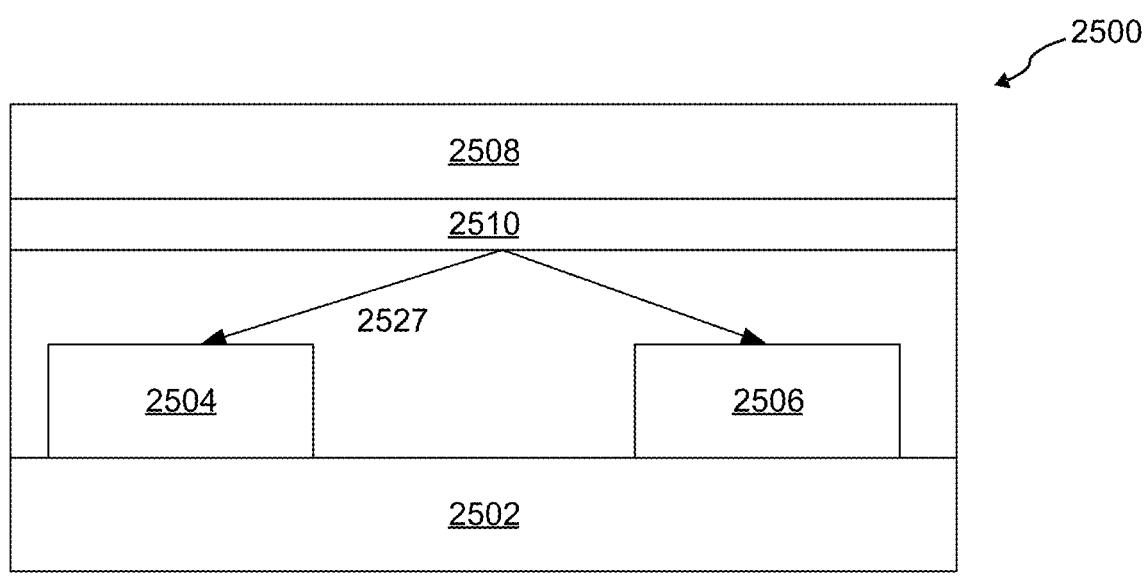
FIG. 25 exemplarily shows in a schematic cross-section a package system or package according to various aspects.

FIG. 25 illustrates in a schematic cross-section a package system 2500 or package 2500 according to various aspects.

The package system 2500 according to various aspects includes at least a first package 2504 and a second package 2506 on a package carrier 2502. The first package 2504 and the second package 2506 may be arranged on a same side of the package carrier 2502. Each of the first package 2504 and the second package 2506 may include an antenna to transmit and/or receive radio frequency signals, e.g. see FIG. 9. A cover 2508 may be arranged at a distance over the first package 2504 and the second package 2506 at the same side of the package carrier 2502 as the first package 2504 and the second package 2506. The cover 2508 may include at least one conductive element 2510 forming a predefined pattern on a side of the cover 2508 facing the first package 2504 and the second package 2506. The predefined pattern may be configured as a frequency selective surface. The package system may further include a radio frequency signal interface 2527 wirelessly connecting the antennas of the first package 2504 and the second package 2506. The radio frequency signal interface 2527 may include the at least one conductive element.

In various aspects, the cover 2506 with conductive elements may be arranged on at least one of the top side, the bottom side, or the top side and the bottom side regarding the side of the package carrier 2502 on which the first package 2504 and the second package 2506 are arranged. As an example, reflection may occur on the top side and/or the bottom side.

The package according to various aspects includes at least a first die 2504 and a second die 2506 on a carrier 2502. The first die 2504 and the second die 2506 may be arranged on a same side of the carrier 2502. Each of the first die 2504 and the second die 2506 may include an antenna to transmit and/or receive radio frequency signals, see FIG. 9. A cover 2508 may be arranged at a distance over the first die 2504 and the second die 2506 at the same side of the carrier 2502 as the first die 2504 and the second die 2506. The cover 2508 may include at least one conductive element 2510 forming a predefined pattern on a side of the cover 2508 facing the first die 2504 and the second die 2506. The predefined pattern may be configured as a frequency selective surface. The package 2500 may further include a radio frequency signal interface 2527 wirelessly connecting the antennas of the first die 2504 and the second die 2506. The radio frequency signal interface 2527 may include the at least one conductive element 2510.

The at least one conductive element may be configured as electrically floating. The frequency selective surface may be configured selective for the frequencies of radio frequency signal interface. The at least one conductive element may include a plurality of metal structures. The plurality of metal structures may be electrically isolated from each other.

The cover 2508 may be attached to the package carrier.

The predefined pattern may be configured as a reflector array. In various aspects, the predefined pattern may be configured as a planar structure, a 2.5D structure(s), or 3D structure(s). A reflector array having one or more 2.5D or 3D structure(s) may provide a larger angular coverage or field of view.

The cover 2508 may include a multilayer structure. Further, the multilayer structure may include the frequency selective surface. The cover 2508 includes a flexible carrier. Further, the multilayer structure may be arranged on the flexible carrier. The flexible carrier may include at least one dielectric layer. The cover 2508 may include a metallic cover 2508. Further, the multilayer structure may be conformably attached to the metallic cover 2508.

The flexible carrier may include an electronic switch. Further, the electronic switch may be at least one of a switch embedded in the flexible carrier, a switch integrated in the flexible carrier or a switch printed out on the flexible carrier. The flexible carrier may have a thickness in a range of about 0.5 mm to 5.0 mm. The flexible carrier may include or may be formed of a material having a relative dielectric permittivity in a range of about 3 to 6.

At least one of the first package/die 2504 or the second package/die 2506 may include an edge antenna. The edge antenna may be configured to be coupled to the reflector array in a near field.

The predefined pattern may include a plurality of unit cells. The plurality of unit cells may be part of the reflector array.

The plurality of unit cells may be embedded in the flexible carrier. Each of the unit cells may include a 1-bit phase shifter. The 1-bit phase shifter may include a first NMOS transistor switch and a second NMOS transistor switch. Further, a slot line may be arranged on a ground plane of the multilayer structure.

The multilayer structure may include a microstrip patch array. Further, the microstrip patch array may be the predefined pattern configured as the frequency selective surface. At least one of the size of the patch or the period of the patch may be configured regarding a predefined resonant frequency of the frequency selective surface.

The predefined pattern may include a first varactor diode and a second varactor diode.

The cover 2508 may include a bias network based on rows and columns. A unit cell may be arranged at each crossing point of the rows and columns. Further, each unit cells of the least one of the same row or the same column may be coupled to a common control line. Each of the unit cells may be configured to accept a first input voltage and a second input voltage to drive a first varactor or a second varactor.

At least one of the size of the patch of unit cell or the length of the strip line of the first control line or the second control line may be configured regarding a predefined resonant frequency of the frequency selective surface.

The predefined pattern may be configured as a holographic pattern including a plurality of unit cells.

In the following, various aspects of the present disclosure will be illustrated:

Example 1 is a package system, including at least a first package and a second package on a package carrier. The first package and the second package may be arranged on a same side of the package carrier. Each of the first package and the second package may include an antenna to transmit and/or receive radio frequency signals; a cover arranged at a distance over the first package and the second package at the same side of the package carrier as the first package and the second package. The cover may include at least one conductive element forming a predefined pattern on a side of the cover facing the first package and the second package. The predefined pattern may be configured as a frequency selective surface. The package system may further include a radio frequency signal interface wirelessly connecting the antennas of the first package and the second package. The radio frequency signal interface may include the at least one conductive element.

In Example 2, the subject matter of Example 1 can optionally that the at least one conductive element may be configured as electrically floating.

In Example 3, the subject matter of Example 1 or 2 can optionally that the frequency selective surface may be configured selective for the frequencies of radio frequency signal interface.

In Example 4, the subject matter of Example 1 can optionally that the at least one conductive element may include a plurality of metal structures.

In Example 5, the subject matter of Example 4 can optionally that the plurality of metal structures may be electrically isolated from each other.

In Example 6, the subject matter of any one of Examples 1 to 5 can optionally that the cover may be attached to the package carrier.

In Example 7, the subject matter of any one of Examples 1 to 6 can optionally that the predefined pattern may be configured as a reflector array.

In Example 8, the subject matter of any one of Examples 1 to 7 can optionally that the cover may include a multilayer structure. Further, the multilayer structure may include the frequency selective surface.

In Example 9, the subject matter of any one of Example 8 can optionally that the cover includes a flexible carrier. Further, the multilayer structure may be arranged on the flexible carrier.

In Example 10, the subject matter of Example 9 can optionally that the flexible carrier may include at least one dielectric layer.

In Example 11, the subject matter of any one of Examples 8 to 10 can optionally that the cover may include a metallic cover. Further, the multilayer structure may be conformably attached to the metallic cover.

In Example 12, the subject matter of any one of Examples 9 to 11 can optionally that the flexible carrier may include an electronic switch. Further, the electronic switch may be at least one of a switch embedded in the flexible carrier, a switch integrated in the flexible carrier or a switch printed out on the flexible carrier.

In Example 13, the subject matter of any one of Examples 9 to 12 can optionally that the flexible carrier has a thickness in a range of about 0.5 mm to 5.0 mm.

In Example 14, the subject matter of any one of Examples 9 to 13 can optionally that the flexible carrier may include or may be formed of a material having a relative dielectric permittivity in a range of about 3 to 6.

In Example 15, the subject matter of any one of Examples 1 to 14 can optionally that at least one of the first package or the second package may include an edge antenna. The edge antenna may be configured to be coupled to the reflector array in a near field.

In Example 16, the subject matter of any one of Examples 1 to 15 can optionally that the predefined pattern may include a plurality of unit cells. The plurality of unit cells may include the reflector array.

In Example 17, the subject matter of Example 16 can optionally that the plurality of unit cells may be embedded in the flexible carrier.

In Example 18, the subject matter of any one of Examples 16 to 17 can optionally that each of the unit cells may include a 1-bit phase shifter.

In Example 19, the subject matter of Example 18 can optionally that the 1-bit phase shifter may include a first NMOS transistor switch and a second NMOS transistor switch. Further, a slot line may be arranged on a ground plane of the multilayer structure.

In Example 20, the subject matter of any one of Examples 8 to 19 can optionally that the multilayer structure may include a microstrip patch array. Further, the microstrip patch array may be the predefined pattern configured as the frequency selective surface.

In Example 21, the subject matter of Example 20 can optionally that at least one of the size of the patch or the period of the patch may be configured regarding a predefined resonant frequency of the frequency selective surface.

In Example 22, the subject matter of any one of Examples 16 to 21 can optionally that the predefined pattern may include a first varactor diode and a second varactor diode.

In Example 23, the subject matter of any one of Examples 16 to 22 can optionally that the cover may include a bias network based on rows and columns. A unit cell may be arranged at each crossing point of the rows and columns. Further, each unit cells of the least one of the same row or the same column may be coupled to a common control line.

In Example 24, the subject matter of any one of Examples 16 to 23 can optionally that each of the unit cells may be configured to accept a first input voltage and a second input voltage to drive a first varactor or a second varactor.

In Example 25, the subject matter of any one of Examples 23 or 24 can optionally that at least one of the size of the patch of unit cell or the length of the strip line of the first control line or the second control line may be configured regarding a predefined resonant frequency of the frequency selective surface.

In Example 26, the subject matter of any one of Examples 1 to 25 can optionally that the predefined pattern may be configured as a holographic pattern including a plurality of unit cells.

Example 27 is a package, including at least a first die and a second die on a carrier. The first die and the second die may be arranged on a same side of the carrier. Each of the first die and the second die may include an antenna to transmit and/or receive radio frequency signals; a cover arranged at a distance over the first die and the second die at the same side of the carrier as the first die and the second die. The cover may include at least one conductive element forming a predefined pattern on a side of the cover facing the first die and the second die. The predefined pattern may be configured as a frequency selective surface. The package may further include a radio frequency signal interface wirelessly connecting the antennas of the first die and the second die. The radio frequency signal interface may include the at least one conductive element.

In Example 28, the subject matter of Example 27 can optionally that the at least one conductive element may be configured as electrically floating.

In Example 29, the subject matter of Example 27 or 28 can optionally that the frequency selective surface may be configured selective for the frequencies of radio frequency signal interface.

In Example 30, the subject matter of Example 27 can optionally that the at least one conductive element may include a plurality of metal structures.

In Example 31, the subject matter of Example 30 can optionally that the plurality of metal structures may be electrically isolated from each other.

In Example 32, the subject matter of any one of Examples 27 to 31 can optionally that the cover may be attached to the package carrier.

In Example 33, the subject matter of any one of Examples 27 to 33 can optionally that the predefined pattern may be configured as a reflector array.

In Example 34, the subject matter of any one of Examples 27 to 33 can optionally that the cover may include a multilayer structure. Further, the multilayer structure may include the frequency selective surface.

In Example 35, the subject matter of any one of Example 34 can optionally that cover incudes a flexible carrier. Further, the multilayer structure may be arranged on the flexible carrier.

In Example 36, the subject matter of Example 35 can optionally that the flexible carrier may include at least one dielectric layer.

In Example 37, the subject matter of any one of Examples 34 to 36 can optionally that the cover may include a metallic cover. Further, the multilayer structure may be conformably attached to the metallic cover.

In Example 38, the subject matter of any one of Examples 35 to 37 can optionally that the flexible carrier may include an electronic switch. Further, the electronic switch may be at least one of a switch embedded in the flexible carrier, a switch integrated in the flexible carrier or a switch printed out on the flexible carrier.

In Example 39, the subject matter of any one of Examples 35 to 38 can optionally that the flexible carrier has a thickness in a range of about 0.5 mm to 5.0 mm.

In Example 40, the subject matter of any one of Examples 35 to 39 can optionally that the flexible carrier may include or may be formed of a material having a relative dielectric permittivity in a range of about 3 to 6.

In Example 41, the subject matter of any one of Examples 27 to 40 can optionally that at least one of the first die or the second die may include an edge antenna. The edge antenna may be configured to be coupled to the reflector array in a near field.

In Example 42, the subject matter of any one of Examples 27 to 41 can optionally that the predefined pattern may include a plurality of unit cells. The plurality of unit cells may be part of the reflector array.

In Example 43, the subject matter of Example 42 can optionally that the plurality of unit cells may be embedded in the flexible carrier.

In Example 44, the subject matter of any one of Examples 42 to 43 can optionally that each of the unit cells may include a 1-bit phase shifter.

In Example 45, the subject matter of Example 44 can optionally that the 1-bit phase shifter may include a first NMOS transistor switch and a second NMOS transistor switch. Further, a slot line may be arranged on a ground plane of the multilayer structure.

In Example 46, the subject matter of any one of Examples 34 to 45 can optionally that the multilayer structure may include a microstrip patch array. Further, the microstrip patch array may be the predefined pattern configured as the frequency selective surface.

In Example 47, the subject matter of Example 46 can optionally that at least one of the size of the patch or the period of the patch may be configured regarding a predefined resonant frequency of the frequency selective surface.

In Example 48, the subject matter of any one of Examples 42 to 47 can optionally that the predefined pattern may include a first varactor diode and a second varactor diode.

In Example 49, the subject matter of any one of Examples 42 to 47 can optionally that the cover may include a bias network based on rows and columns. A unit cell may be arranged at each crossing point of the rows and columns. Further, each unit cells of the least one of the same row or the same column may be coupled to a common control line.

In Example 50, the subject matter of any one of Examples 42 to 49 can optionally that each of the unit cells may be configured to accept a first input voltage and a second input voltage to drive a first varactor or a second varactor.

In Example 51, the subject matter of any one of Examples 49 or 50 can optionally that at least one of the size of the patch of unit cell or the length of the strip line of the first control line or the second control line may be configured regarding a predefined resonant frequency of the frequency selective surface.

In Example 52, the subject matter of any one of Examples 27 to 51 can optionally that the predefined pattern may be configured as a holographic pattern including a plurality of unit cells.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring structure to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring structure to a subset of a set that contains less elements than the set.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, unless otherwise specified the use of the ordinal adjectives "first", "second", "third" etc., to describe a common object, merely indicate that different instances of like objects are being referred to, and are not intended to imply that the objects so described must be in a given sequence, either temporally, spatially, in ranking, or in any other manner.

The term "semiconductor carrier" is defined to mean any construction including semiconductor material, for example, a silicon carrier with or without an epitaxial layer, a silicon-on-insulator carrier containing a buried insulator layer, or a carrier with a silicon germanium layer. The term "integrated circuits" as used herein refers to electronic circuits having multiple individual circuit elements, such as transistors, diodes, resistors, capacitors, inductors, and other active and passive semiconductor devices.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a signal may be transmitted or conducted through a signal chain in which the signal is processed to change characteristics such as phase, amplitude, frequency, and so on. The signal may be referred to as the same signal even as such characteristics are adapted. In general, so long as a signal continues to encode the same information, the signal may be considered as the same signal. For example, a transmit signal may be considered as referring structure to the transmit signal in baseband, intermediate, and radio frequencies.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As used herein, "memory" is understood as a computer-readable medium (e.g., a non-transitory computer-readable medium) in which data or information can be stored for retrieval. References to "memory" included herein may thus be understood as referring structure to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

The term "antenna" or "antenna structure", as used herein, may include any suitable configuration, structure and/or arrangement of one or more antenna elements, components, units, assemblies and/or arrays. In some aspects, the antenna may implement transmit and receive functionalities using separate transmit and receive antenna elements. In some aspects, the antenna may implement transmit and receive functionalities using common and/or integrated transmit/receive elements. The antenna may include, for example, a phased array antenna, a single element antenna, a set of switched beam antennas, and/or the like.

As used herein, the term "chiplet" includes an integrated circuit block of a multi-chip module (MCM) or MCM devices. A chiplet can be considered as typically a sub processing unit or a disaggregated functional resource with a specialized function that is designed to integrate with other chiplets of a same multi-chip device or module. A chiplet may be fabricated on its own individual semiconductor die with physical dimensions that are often smaller than other chips or processors. The MCM provides interconnections of the chiplets so as to form complete electronic function(s).

In aspects of the disclosure, where appropriate, the term "die" may refer to a block of semiconductor material on which a component, e.g., a chip or chiplet is fabricated. In appropriate cases the term "die" may be used to refer to the integrated circuit fabricated from the semiconductor material (e.g., a chip, chiplet, etc.) and vice versa.

A multi-chip module or MCM can be an electronic assembly that may be a single package including multiple components. In examples herein, an MCM can be a plurality of chiplets arranged in a single package including die-to-die interconnect schemes for connecting the chiplets. In such cases, the chiplets of an MCM can be integrated and mounted onto a unifying carrier, so that in use it can be treated as if it were a larger IC. The unifying carrier may be the package carrier or package carrier. The chiplets (and possibly other components) of the MCM may also share a common encapsulation and a common integrated head spreader (IHS).

An MCM may in some cases include components other than chiplets. That is, an MCM may include integrated devices that have with their own packaging, such as, for example, Central Processing Units (CPUs), Graphical Processing Units (GPUs), Field Programmable Gate Array (FPGA), etc. Such components with their own packaging can be arranged on a common carrier or base layer (also denoted as package carrier or board) within in relatively close proximity to each other in the MCM.

As used herein, "racks" or "rack enclosures" may be any type of equipment for housing electronic equipment. Racks house multiple types or sets of electronic equipment with an individual set of electronic equipment being housed within a single rack unit of the rack. Rack units of a rack may be stacked close together, e.g., vertically in some cases. In aspects of the present disclosure, a rack unit may contain or hold one or more circuit boards or simply "boards". Each board can include a plurality of electronic devices, e.g., one or more multi-chip devices mounted the board. A rack may include multiple rack units in enclosed or contained in a common frame structure or chassis.

In this description, the term "package" refers to hardware components (e.g., CPU, memory, and I/O devices) that may be interconnected and packed to form a system that may be integrated into a single unit with metallic finishing for physical mounting on a circuit board. That is, a package may be a full hardware module and that may be plugged into a server-chassis.

In this description, the term "predefined pattern" refers to a structure of at least one conductive element of the cover. In other words, the at least one conductive element may be structured such that the predefined pattern is formed. The conductive element having the predefined pattern may be formed on a side of the cover facing the first package or die and the second package or die. The predefined pattern may be configured as a frequency selective surface, e.g. selective for the radio frequency signals to be transmitted between the first package or die and the second package or die. As an example, the predefined pattern of the conductive element of the cover may be configured as a reflector array. As an example, the predefined pattern of the conductive element may be configured as a planar structure, a 2.5D structure(s), or 3D structure(s). The conductive element may be configured such that the predefined pattern includes a plurality of unit cells. The plurality of unit cells may be part of the reflector array. Illustratively, the predefined pattern may include a plurality of repetitive structures in the conductive element.

In various aspects, a package may include a CPU and non-CPU components, such as memory (DRAM modules), I/O devices, and accelerators.

In various aspects, components in a package may be interconnected with silicon vias, metallic wires or wireless by a RF signal interface.

In various aspects, a package may include only a single CPU chip (plus other non-CPU components). In various aspects, a CPU chip may include only one single CPU chip. In various aspects, a CPU chip may include a single CPU die, which in turn may include a plurality of CPU cores. In various aspects, a CPU chip may include a plurality of CPU dice that may be interconnected with an embedded multi-die interconnect bridge.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as RF transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

The term "calibration" as used herein may describe a process in which a device or a component of a device (e.g., a radiohead circuit, a transceiver chain, a component of a transceiver chain, and the like) is calibrated. Illustratively, the term calibration may describe a process in which one or more deviations of a behavior of a device or of one of its components from an expected or desired behavior are corrected. Further illustratively, the term calibration may describe a process in which the operation of a device or of one of its components is aligned with a predefined or desired operation of the device or of the component. By way of example, a calibration may describe a process in which nonlinearities are eliminated and/or in which mismatches are eliminated.

One or more antennas are configured to operate within a plurality of radiofrequency bands; one or more antennas that are each configured to operate within a single radiofrequency band; or a combination thereof. According to one aspect of the disclosure, the antenna or antennas of the radiofrequency device disclosed herein may be configured to operate within radiofrequency bands between 2.4 GHz and 100 GHz. This may include, for example, 2.4 GHz, 5 to 6 GHz, 6 to 7 GHz, or any combination thereof.

Each of the multiple RF FE circuitries may be configured to communicate via the respective multifeed antenna terminal, e.g., by transmitting and/or receiving an analog signal within a respective component carrier frequency range (also referred to as frequency block or as communication channel) via the multifeed antenna terminal. In RF communication, the available frequency spectrum may be divided into multiple bands. Each band may be subdivided into multiple frequency blocks (also referred to as sub-band), which may not overlap each other. For example, the 802.11 standard may provide several distinct radio frequency bands for use in Wi-Fi communications, for example, a so called 900 MHz band, a 2.4 GHz band, a 3.6 GHz band, a 4.9 GHz band, a 5 GHz band, a 5.9 GHz band and the like (denoted according to the lower frequency limit).

A communication channel may have a certain capacity for transmitting information, often measured by its bandwidth (also referred to as channel bandwidth) in hertz (Hz) or its data rate in bits per second. The bandwidth (BW) is the continuous band of frequencies occupied by a modulated carrier signal and denotes the difference between the upper frequency limit and lower frequency limit of the communication channel. The maximum possible data rate per user is increased the more communication channels are assigned to the wireless mobile device, e.g., a respective communication conducted by the wireless mobile device (e.g., on software-level).

Some examples may be used in various wireless communication devices, for example, a User Equipment (UE), a Mobile Device (MD), a wireless station (STA), a Personal Computer (PC), a desktop computer, a mobile computer, a laptop computer, a notebook computer, a tablet computer, a server computer, a handheld computer, a sensor device, an Internet of Things (IoT) device, a wearable device, a handheld device, a Personal Digital Assistant (PDA) device, a hybrid device, a vehicular device, a non-vehicular device, a wireless communication station, a wireless Access Point (AP), a wireless router, a wireless modem, a video device, an audio device, an audio-video (A/V) device.

Some examples may be used for "peer to peer (PTP) communication", which may relate to device-to-device communication over a wireless link ("peer-to-peer link") between devices. The PTP communication may include, for example, a Wi-Fi Direct (WFD) communication, e.g., a WFD Peer to Peer (P2P) communication, wireless communication over a direct link within a Quality of Service (QoS) basic service set (BSS), a tunneled direct-link setup (TDLS) link, a STA-to-STA communication in an independent basic service set (IBSS), a Wi-Fi Aware communication, a Vehicle-to-Anything (V2X) communication, an IoT communication, or the like. Other aspects may be implemented for any other additional or alternative communication scheme and/or technology.

Some examples may be used in devices operating in accordance with existing IEEE 802.11 standards (including IEEE 802.11-2016 (IEEE 802.11-2016, IEEE Standard for Information technology—Telecommunications and information exchange between systems local and metropolitan area networks—Specific requirements Part 11: Wireless LAN Medium Access Control (MAC) and Physical Layer (PHY) Specifications, Dec. 7, 2016)), and/or future versions and/or derivatives thereof (e.g., wireless local area network stations (WLAN STAs) or WiFi stations (WiFi STAs)), including any device that contains an IEEE 802.11-conformant media access control (MAC) and physical layer (PHY) interface to the wireless medium (WM).

Some examples may be used in conjunction with a WLAN, e.g., a WiFi network. Other aspects may be used in conjunction with any other suitable wireless communication network, for example, a wireless area network, a "piconet", a WPAN, a WVAN and the like.

Some examples may be used in conjunction with a wireless communication network communicating over a frequency band of 2.4 GHz, 5 GHz, and/or 6-7 GHz. However, other aspects may be implemented utilizing any other suitable wireless communication frequency bands, for example, an Extremely High Frequency (EHF) band (the millimeter wave (mmWave) frequency band), e.g., a frequency band within the frequency band of between 20 GHz and 300 GHz, a WLAN frequency band, a WPAN frequency band, and the like.

Some examples may be used in devices operating in accordance with existing cellular specifications and/or protocols, e.g., 3rd Generation Partnership Project (3GPP) Long Term Evolution (LTE), 3GPP 5G, and/or future versions and/or derivatives thereof, units and/or devices which are part of the above networks, and the like.

Some examples may be used for one way and/or two-way radio communication systems, cellular radio-telephone communication systems, a cellular telephone, a WLAN telephone, a Personal Communication Systems (PCS) device, a device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a Single Input Multiple Output (SIMO) transceiver or device, a Multiple Input Single Output (MISO) transceiver or device, a device having one or more internal antennas and/or external antennas, Digital Video Broadcast (DVB) devices or systems, multi-standard radio devices or systems, a wired or wireless handheld device, e.g., a Smartphone, a Wireless Application Protocol (WAP) device, or the like.

Some examples may be used in conjunction with one or more types of wireless communication signals and/or systems, for example, Radio Frequency (RF), Infra-Red (IR), Frequency-Division Multiplexing (FDM), Orthogonal FDM (OFDM), Orthogonal Frequency-Division Multiple Access (OFDMA), Spatial Divisional Multiple Access (SDMA), Time-Division Multiplexing (TDM), Time-Division Multiple Access (TDMA), Multi-User MIMO (MU-MIMO), General Packet Radio Service (GPRS), extended GPRS (EGPRS), Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth☐, Global Positioning System (GPS), Wi-Fi, Wi-Max, ZigBee™, Ultra-Wideband (UWB), Global System for Mobile communication (GSM), 2G, 2.5G, 3G, 3.5G, 4G, Fifth Generation (5G) mobile networks, 3GPP, Long Term Evolution (LTE), LTE advanced, Enhanced Data rates for GSM Evolution (EDGE), or the like. Other aspects may be used in various other devices, systems and/or networks.

What is claimed is:

1. A package system, comprising:
   at least a first package and a second package on a package carrier, wherein the first package and the second package are arranged on a same side of the package carrier, wherein each of the first package and the second package comprises an antenna to transmit and/or receive radio frequency signals;
   a cover arranged at a distance over the first package and the second package at the same side of the package carrier as the first package and the second package,
   wherein the cover comprises at least one conductive element forming a predefined pattern on a side of the cover facing the first package and the second package,
   wherein the predefined pattern is configured as a frequency selective surface; and
   a radio frequency signal interface wirelessly connecting the antennas of the first package and the second package, wherein the radio frequency signal interface comprises the at least one conductive element.

2. The package system of claim 1,
   wherein the at least one conductive element is configured as electrically floating.

3. The package system of claim 1,
   wherein the frequency selective surface is configured selective for the frequencies of radio frequency signal interface.

4. The package system of claim 1,
   wherein the at least one conductive element comprises a plurality of metal structures.

5. The package system of claim 4,
   wherein the plurality of metal structures are electrically isolated from each other.

6. The package system of claim 1,
   wherein the predefined pattern is configured as a reflector array.

7. The package system of claim 1,
   wherein the cover comprises a multilayer structure, and wherein the multilayer structure comprises the frequency selective surface.

8. The package system of claim 7,
   wherein cover incudes a flexible carrier, and wherein the multilayer structure is arranged on the flexible carrier.

9. The package system of claim 8,
   wherein the flexible carrier comprises at least one dielectric layer.

10. The package system of claim 7,
    wherein the cover comprises a metallic cover, and wherein the multilayer structure is conformably attached to the metallic cover.

11. The package system of claim 8,
    wherein the flexible carrier comprises an electronic switch, and wherein the electronic switch is at least one of a switch embedded in the flexible carrier, a switch integrated in the flexible carrier or a switch printed out on the flexible carrier.

12. The package system of claim 8,
    wherein the flexible carrier has a thickness in a range of about 0.5 mm to 5.0 mm, and wherein the flexible carrier comprises or is formed of a material having a relative dielectric permittivity in a range of about 3 to 6.

13. The package system of claim 1,
wherein at least one of the first package or the second package comprises an edge antenna, wherein the edge antenna is configured to be coupled to the reflector array in a near field.

14. The package system of claim 1,
wherein the predefined pattern comprises a plurality of unit cells, wherein the plurality of unit cells is part of the reflector array.

15. The package system of claim 14,
wherein the plurality of unit cells are embedded in the flexible carrier.

16. The package system of claim 14,
wherein each of the unit cells comprises a 1-bit phase shifter.

17. The package system of claim 16,
wherein the 1-bit phase shifter comprises a first NMOS transistor switch and a second NMOS transistor switch, and wherein a slot line is arranged on a ground plane of the multilayer structure.

18. The package system of claim 7,
wherein the multilayer structure comprises a microstrip patch array, and wherein the microstrip patch array is the predefined pattern configured as the frequency selective surface.

19. The package system of claim 18,
wherein at least one of the size of the patch or the period of the patch is configured regarding a predefined resonant frequency of the frequency selective surface.

20. The package system of claim 1,
wherein the predefined pattern comprises a first varactor diode and a second varactor diode.

21. The package system of claim 14,
wherein the cover comprises a bias network based on rows and columns, wherein a unit cell is arranged at each crossing point of the rows and columns, and wherein each unit cells of the least one of the same row or the same column are coupled to a common control line.

22. The package system of claim 14,
wherein each of the unit cells is configured to accept a first input voltage and a second input voltage to drive a first varactor or a second varactor.

23. The package system of claim 1,
wherein the predefined pattern is configured as a holographic pattern comprising a plurality of unit cells.

24. A package, comprising:
at least a first die and a second die on a carrier, wherein the first die and the second die are arranged on a same side of the carrier, wherein each of the first die and the second die comprises an antenna to transmit and/or receive radio frequency signals;
a cover arranged at a distance over the first die and the second die at the same side of the carrier as the first die and the second die,
wherein the cover comprises at least one conductive element forming a predefined pattern on a side of the cover facing the first die and the second die, wherein the predefined pattern is configured as a frequency selective surface; and
a radio frequency signal interface wirelessly connecting the antennas of the first die and the second die, wherein the radio frequency signal interface comprises the at least one conductive element.

\* \* \* \* \*

UNITED STATES PATENT AND TRADEMARK OFFICE
CERTIFICATE OF CORRECTION

| | | |
|---|---|---|
| PATENT NO. | : 12,009,321 B2 | Page 1 of 1 |
| APPLICATION NO. | : 17/131863 | |
| DATED | : June 11, 2024 | |
| INVENTOR(S) | : Zhen Zhou et al. | |

It is certified that error appears in the above-identified patent and that said Letters Patent is hereby corrected as shown below:

On the Title Page

In item (72) Inventors:
Change "Chia-Pin Chiu, Tempe, OR (US)" to --Chia-Pin Chiu, Tempe, AZ (US)--

Signed and Sealed this
Sixteenth Day of July, 2024

Katherine Kelly Vidal
*Director of the United States Patent and Trademark Office*